(12) United States Patent
Wu et al.

(10) Patent No.: US 12,540,153 B2
(45) Date of Patent: Feb. 3, 2026

(54) PLATINUM COMPLEX HAVING ONCN TETRADENTATE LIGAND AND CONTAINING CARBAZOLE

(71) Applicant: GUANGDONG AGLAIA OPTOELECTRONIC MATERIALS CO., LTD, Guangdong (CN)

(72) Inventors: Xinwei Wu, Foshan (CN); Huiyang Li, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 407 days.

(21) Appl. No.: 18/038,680

(22) PCT Filed: Oct. 24, 2021

(86) PCT No.: PCT/CN2021/125929
§ 371 (c)(1),
(2) Date: May 24, 2023

(87) PCT Pub. No.: WO2022/111174
PCT Pub. Date: Jun. 2, 2022

(65) Prior Publication Data
US 2024/0032414 A1 Jan. 25, 2024

(30) Foreign Application Priority Data
Nov. 30, 2020 (CN) ......................... 202011366647.8

(51) Int. Cl.
| C07D 401/14 | (2006.01) |
| C07F 15/00 | (2006.01) |
| C09K 11/06 | (2006.01) |
| H10K 85/00 | (2023.01) |
| H10K 85/30 | (2023.01) |
| H10K 50/12 | (2023.01) |

(52) U.S. Cl.
CPC ........ *C07F 15/0086* (2013.01); *C07D 401/14* (2013.01); *C09K 11/06* (2013.01); *H10K 85/00* (2023.02); *H10K 85/346* (2023.02); *C09K 2211/1044* (2013.01); *C09K 2211/185* (2013.01); *H10K 50/12* (2023.02)

(58) Field of Classification Search
CPC .......................... C07D 401/14; C07F 15/0086
See application file for complete search history.

(56) References Cited

U.S. PATENT DOCUMENTS

| 8,877,353 B2 | 11/2014 | Che et al. |
| 10,038,153 B2 | 7/2018 | Che et al. |
| 2018/0062088 A1 | 3/2018 | Cho et al. |
| 2021/0332290 A1 | 10/2021 | Peng et al. |

FOREIGN PATENT DOCUMENTS

| CN | 103097395 A | 5/2013 |
| CN | 106795428 A | 5/2017 |
| CN | 110872325 A | 3/2020 |
| CN | 113717229 A | 11/2021 |

OTHER PUBLICATIONS

Gang Cheng, et al., "Structurally robust phosphorescent [Pt(ONCN)] emitters for high performance organic light-emitting devices with power efficiency up to 126 lm W-1 and external quantum efficiency over 20%," Chem. Sci., vol. 5, pp. 4819-4830 (Aug. 26, 2014).
Mao Mao, et al., "High-performance organic light-emitting diodes with low-efficiency roll-off using bulky tetradentate [Pt(ONCN)] emitters," J. Mater. Chem. C, vol. 7, pp. 7230-7236 (Apr. 11, 2019).

*Primary Examiner* — Shawquia Jackson
(74) *Attorney, Agent, or Firm* — Maschoff Brennan

(57) ABSTRACT

The present invention relates to a platinum complex having an ONCN tetradentate ligand and containing carbazole, and the platinum complex has a structure as shown in a formula (I). The complex has bright green light emission wavelengths, and can be used in the field of OLED organic electroluminescent materials. By means of the structural design, the present invention can improve the heavy atomic effect of phosphorescent materials, enhance spin-spin coupling, and achieve high-efficiency conversion of T1-S0, thereby achieving high luminous efficiency. Moreover, a platinum complex molecule having an ONCN tetradentate ligand has simple synthetic steps and may modifiable sites. The steric hindrance added by the carbazole group contained can effectively reduce the aggregation effect between molecules, avoid the formation of an exciplex, and further improve the color purity and the luminous efficiency.

17 Claims, 1 Drawing Sheet

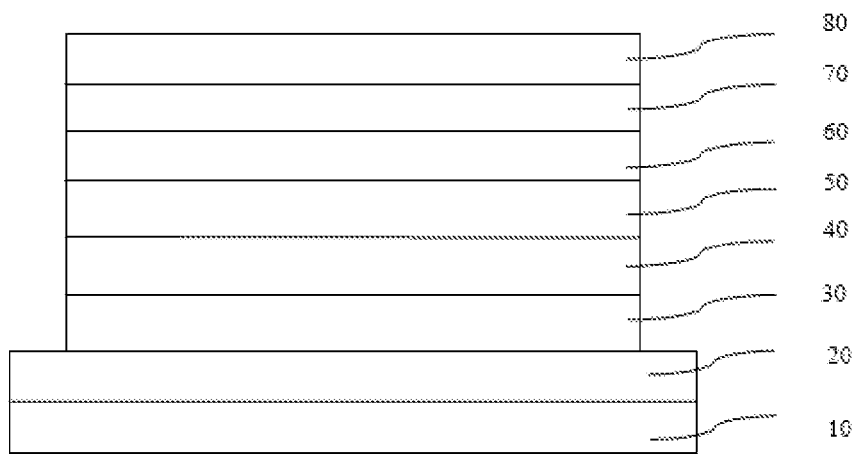

PLATINUM COMPLEX HAVING ONCN TETRADENTATE LIGAND AND CONTAINING CARBAZOLE

TECHNICAL FIELD

The present invention relates to the field of OLED materials, and in particular to a platinum complex having an ONCN tetradentate ligand and containing carbazole.

BACKGROUND

An organic light-emitting diode (OLED) was discovered by a Chinese American professor Ching W. Tang in a laboratory in 1979. Due to the advantages such as self-luminous property, wide viewing angle, almost infinite high contrast, low power consumption, extremely high reaction speed and potential flexible foldability, the OLED has been widely concerned and studied. In the field of OLED materials, phosphorescent OLED doping materials for a light-emitting layer have been develop rapidly and maturely, and mainly include organic complexes based on some heavy metals. Phosphorescent materials can make full use of energy of singlet and triplet excitons in a luminescence process, and achieve the quantum efficiency of 100% theoretically, thus being luminescent materials widely used in the industry at present. Metal complex luminescent materials have been applied in the industry. Traditional industrial phosphorescent OLED doping materials for a light-emitting layer mainly include metal iridium complexes, and metal platinum complexes have been greatly developed in recent years due to excellent material stability caused by planarity, thus showing better properties than the iridium complexes. Luminescent materials having higher efficiency and longer service life are urgently required in the industry at present. A platinum complex molecule having an ONCN tetradentate ligand has simple synthetic steps and may modifiable sites, and can be greatly improved. However, properties, such as luminous efficiency, service life and the like, still need to be further improved.

SUMMARY

In view of the above problems of the prior art, the present invention provides a platinum complex luminescent material having an ONCN tetradentate ligand. The material can improve the heavy atomic effect of phosphorescent materials, thereby improving the utilization rate of energy of singlet and triplet excitons in a luminescence process, so that the luminous efficiency is improved.

The platinum complex applied in an organic light-emitting diode shows good photoelectric properties and device service life.

A platinum complex having an ONCN tetradentate ligand and containing carbazole has a structural formula as shown in a formula (I):

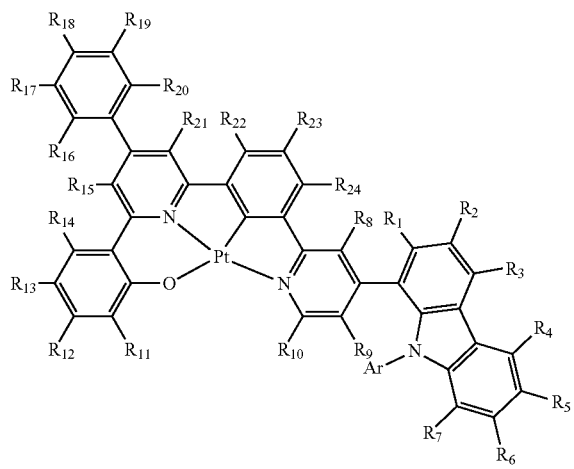

(I)

where $R_1$-$R_{24}$ are independently selected from hydrogen, deuterium, sulfur, halogen, hydroxyl, acyl, alkoxyl containing 1-30 C atoms, acyloxyl, amino, nitro, acylamino, cyano, carboxyl, styrenyl, aminoformyl, benzylcarbonyl, aryloxyl, diarylamino, saturated alkyl containing 1-30 C atoms, unsaturated alkyl containing 2-20 C atoms, substituted or unsubstituted aryl containing 5-30 C atoms, and substituted or unsubstituted heteroaryl containing 5-30 C atoms, or adjacent groups of the $R_1$-$R_{24}$ are connected to each other through a covalent bond to form a ring;

Ar is selected from substituted or unsubstituted aryl containing 6-30 carbon atoms, and substituted or unsubstituted heteroaryl containing 3-30 carbon atoms;

and the "substituted" refers to substitution with deuterium, halogen, amino, nitro, cyano, or $C_1$-$C_4$ alkyl.

Preferably, the $R_1$-$R_{24}$ are independently selected from hydrogen, deuterium, sulfur, halogen, alkoxyl containing 1-10 C atoms, cyano, styrenyl, aryloxyl, diarylamino, saturated alkyl containing 1-10 C atoms, unsaturated alkyl containing 2-8 C atoms, substituted or unsubstituted aryl containing 5-20 C atoms, and substituted or unsubstituted heteroaryl containing 5-20 C atoms, or adjacent groups of the $R_1$-$R_{24}$ are connected to each other through a covalent bond to form a ring.

The Ar is selected from substituted or unsubstituted 2,3- or 3,4-benzoaryl containing 6-30 carbon atoms, substituted or unsubstituted 2,3- or 3,4-benzoheteroaryl containing 3-30 carbon atoms, substituted or unsubstituted phenylaryl containing 6-20 carbon atoms, and substituted or unsubstituted phenylheteroaryl containing 6-20 carbon atoms.

The platinum complex preferably has a structure as shown in a formula (II) or (III) below:

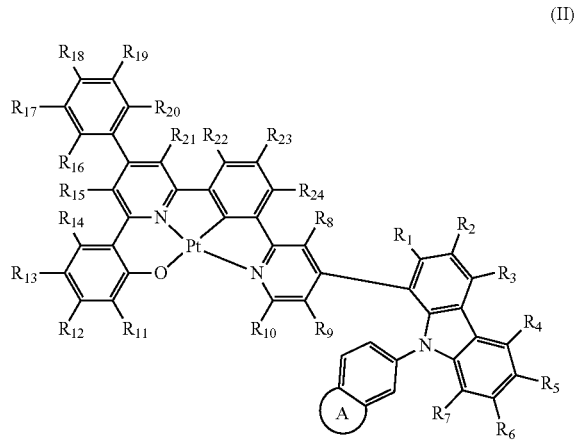

(II)

(III)

where $R_1$-$R_{24}$ are independently selected from hydrogen, deuterium, halogen, cyano, aryloxyl, diarylamino, saturated alkyl containing 1-4 C atoms, unsaturated alkyl containing 2-4 C atoms, substituted or unsubstituted aryl containing 5-10 C atoms, and substituted or unsubstituted heteroaryl containing 5-10 C atoms, or adjacent groups of the $R_1$-$R_{24}$ are connected to each other through a covalent bond to form a ring;

and A and B are substituted or unsubstituted aryl containing 5-30 C atoms, or substituted or unsubstituted heteroaryl containing 5-30 C atoms.

Further preferably, in the general formula (II) or (III), among the $R_1$-$R_{24}$, $R_{17}$ and $R_{19}$ are tert-butyl, and the other groups are hydrogen.

The A and the B are a substituted or unsubstituted five-membered heteroaromatic ring, a six-membered aromatic ring, a six-membered heteroaromatic ring, or a five-membered benzo-heteroaromatic ring.

The platinum metal complex of the present invention is listed below, but is not limited to the structures listed:

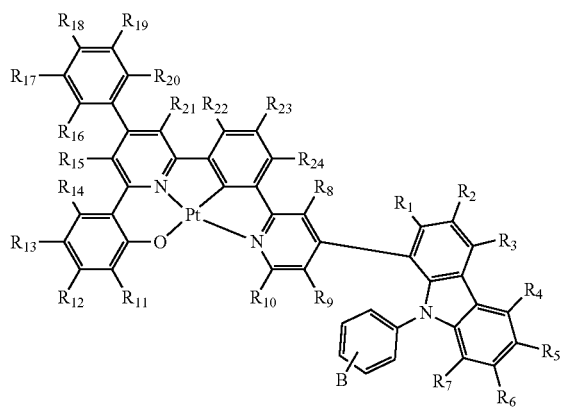

5
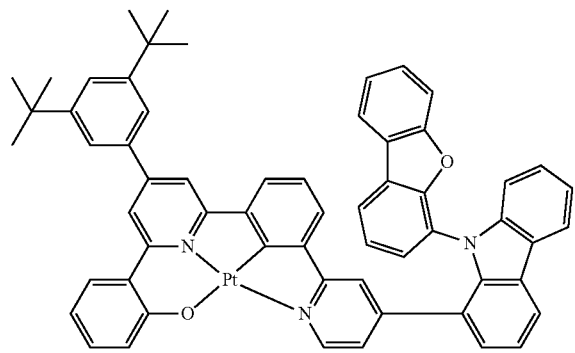
6
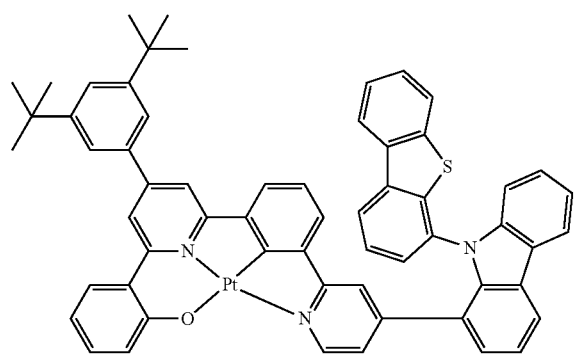
7
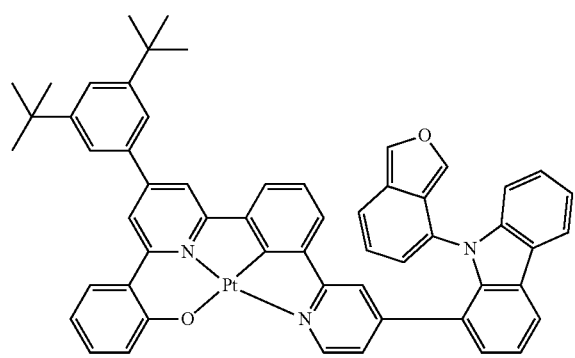
8
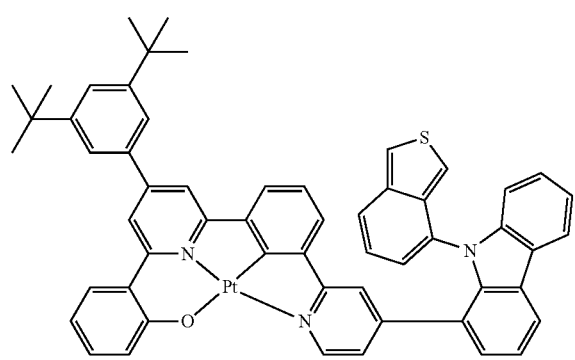
9
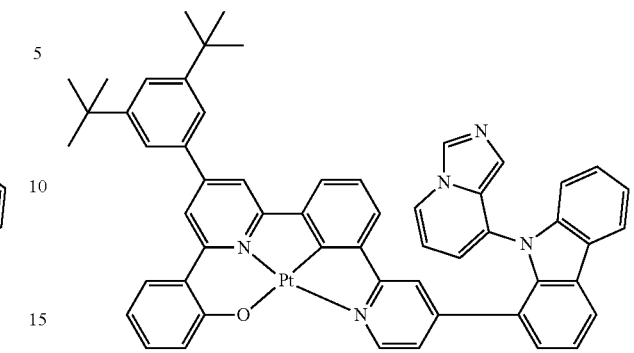
10
11
12
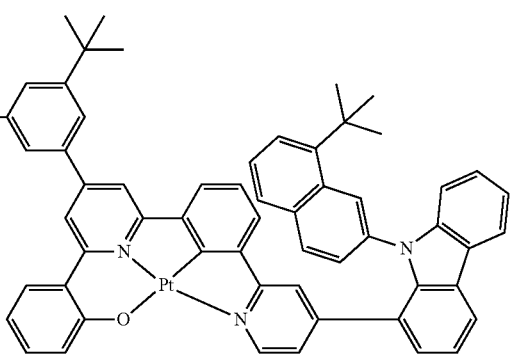

13
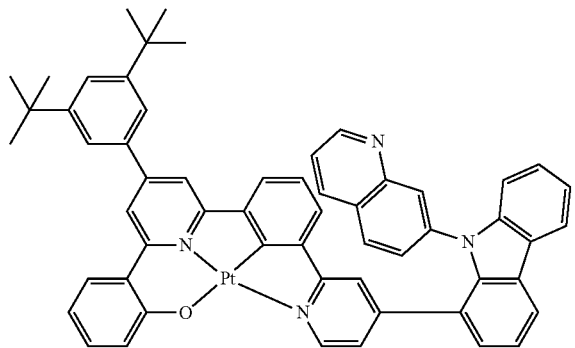
14
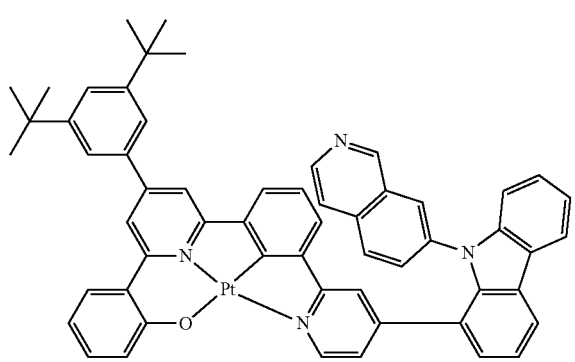
15
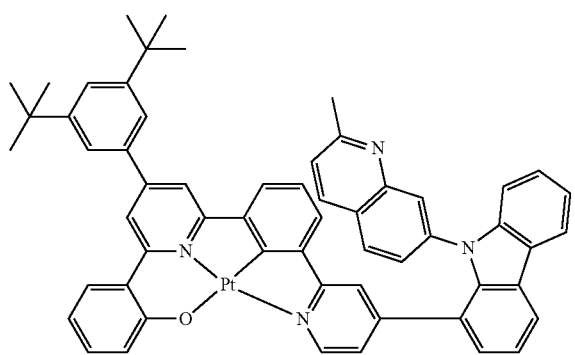
16
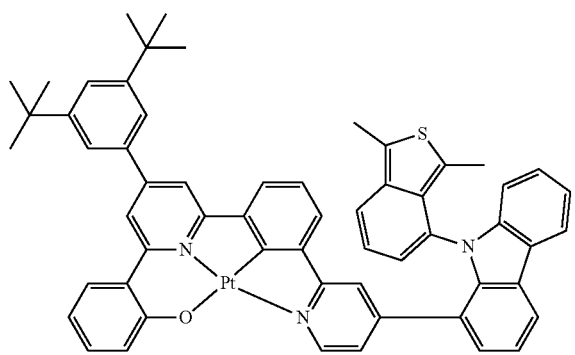
17
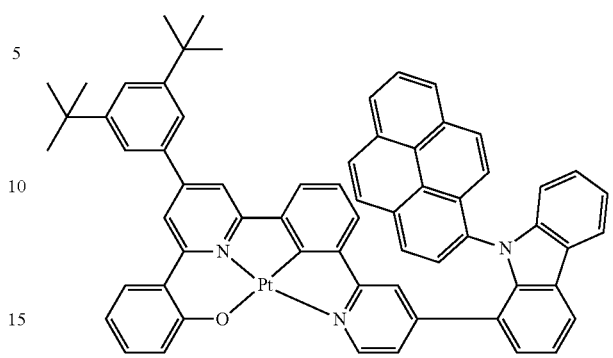
18
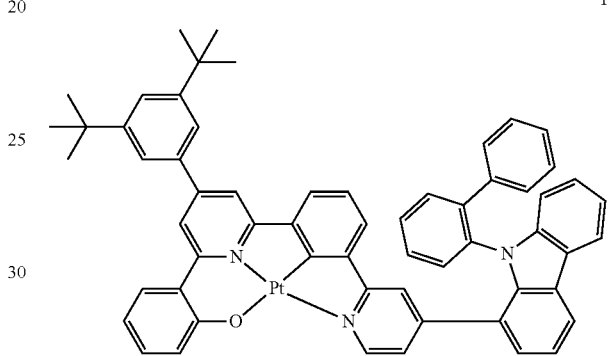
19
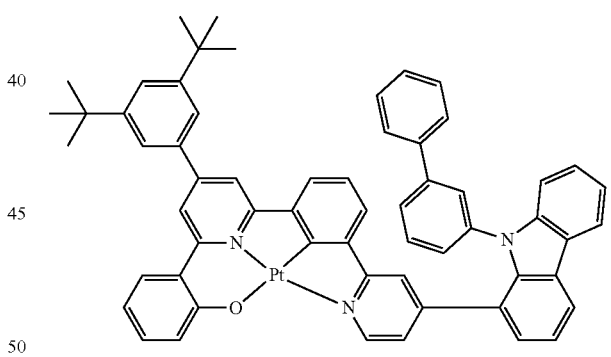
20
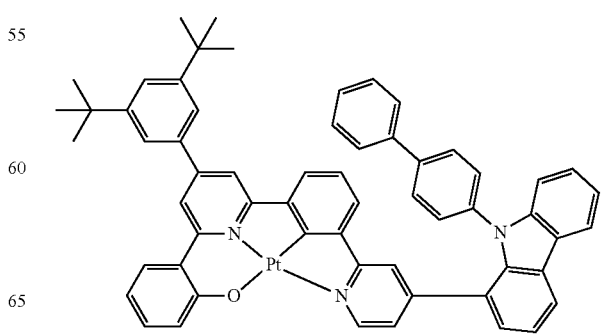

-continued
21
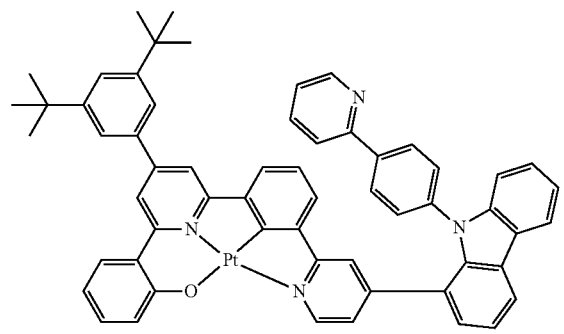
22
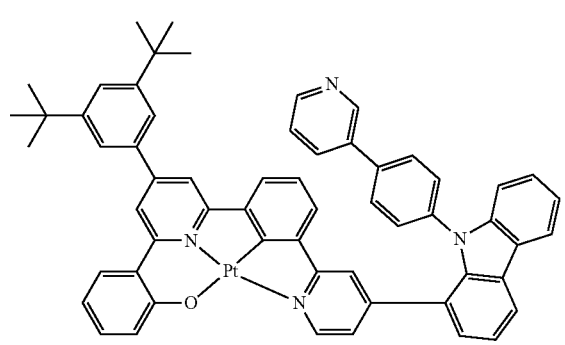
23
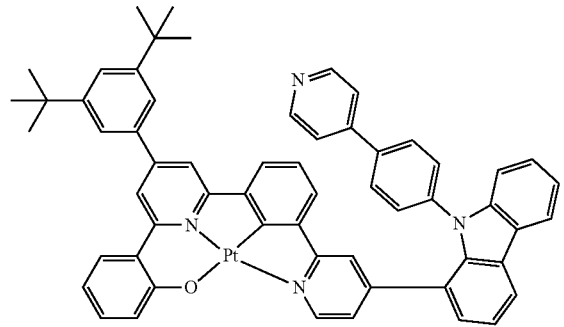
24
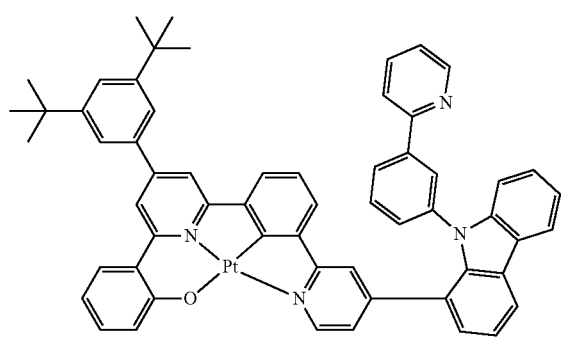
-continued
25
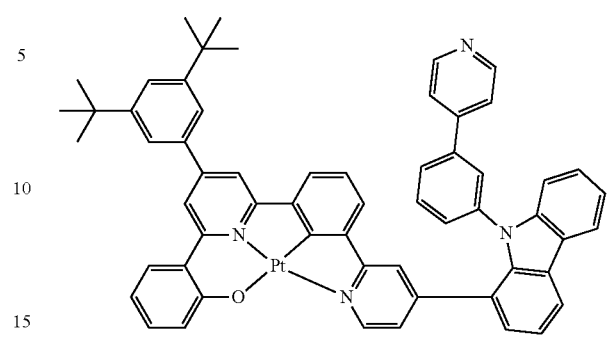
26
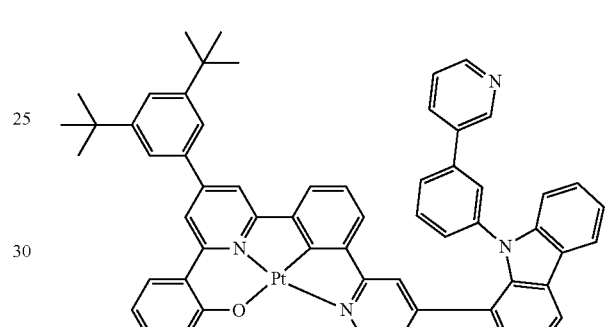
27
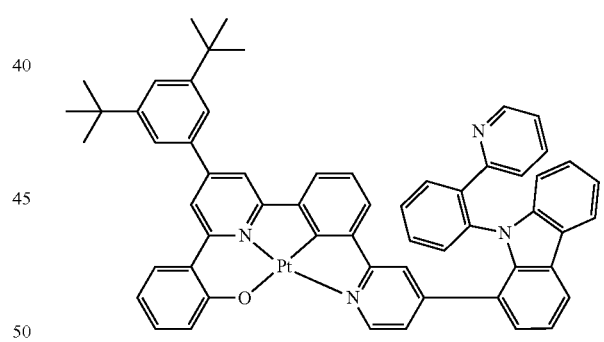
28
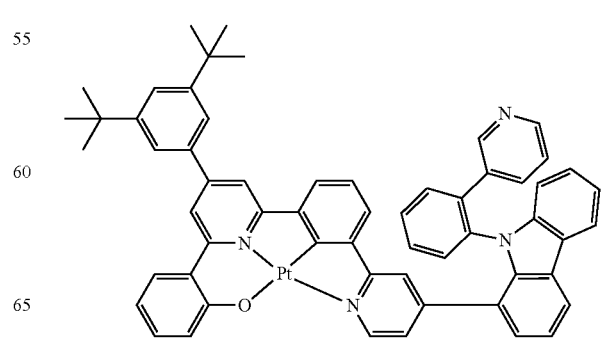

29
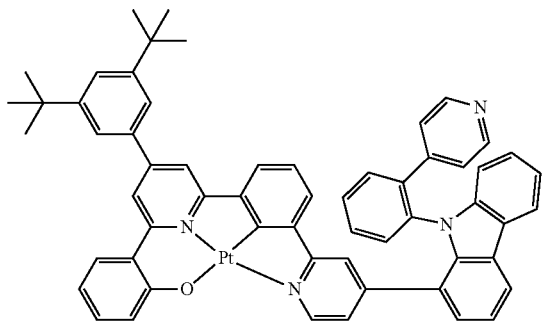
30
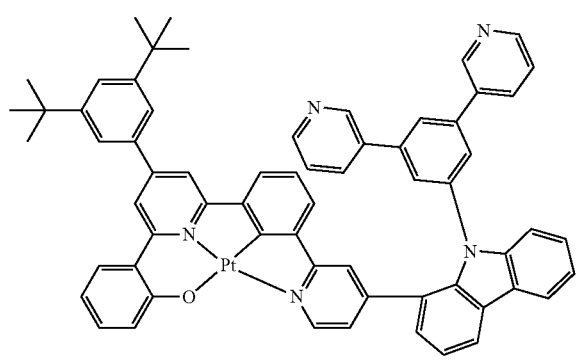
31
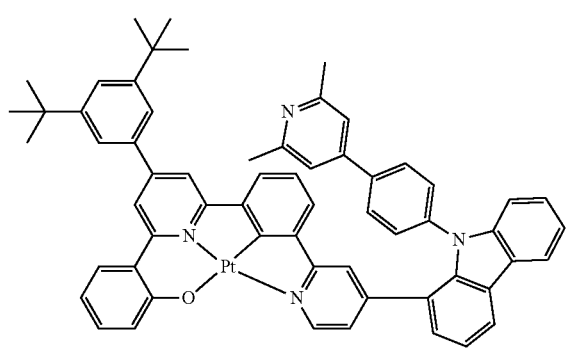
32
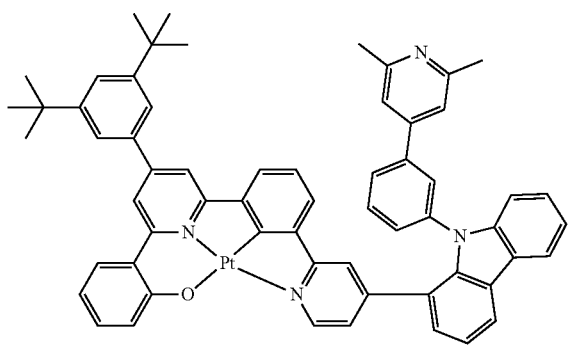
33
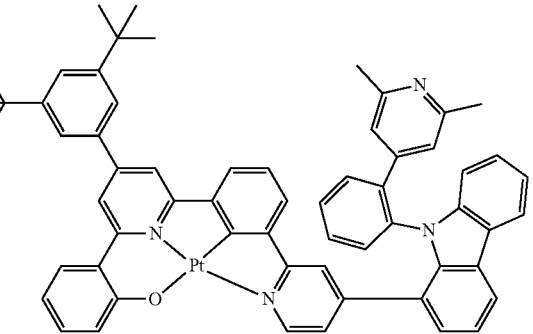
34
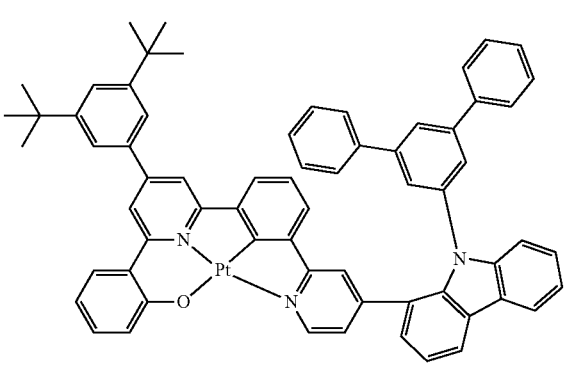
35
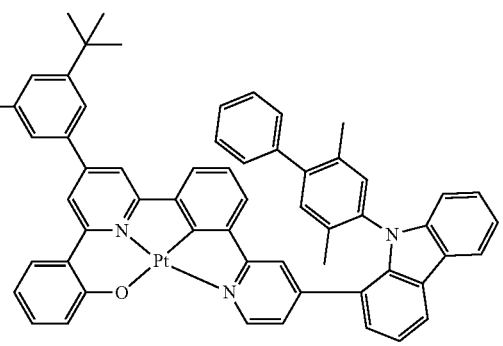
36
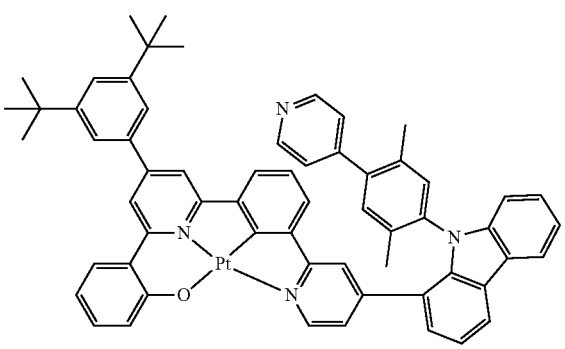

37
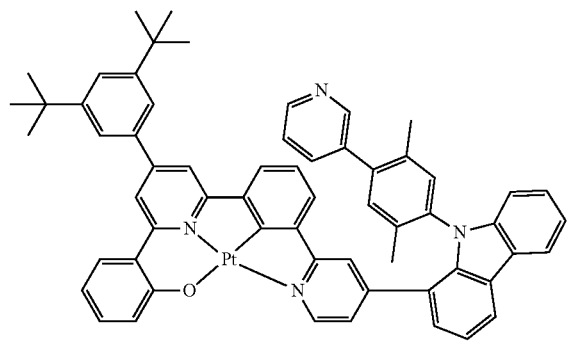
38
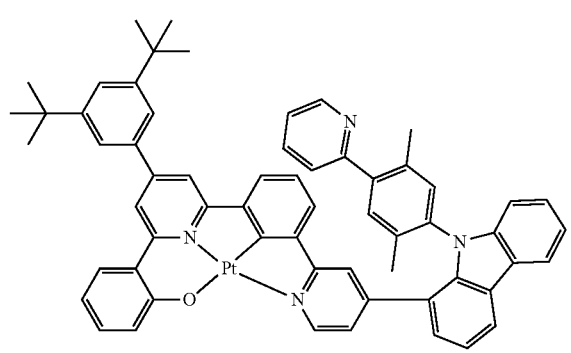
39
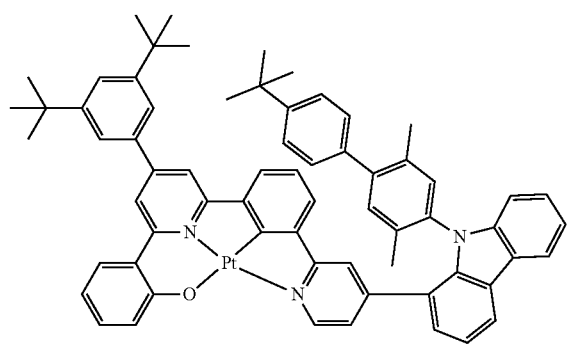
40
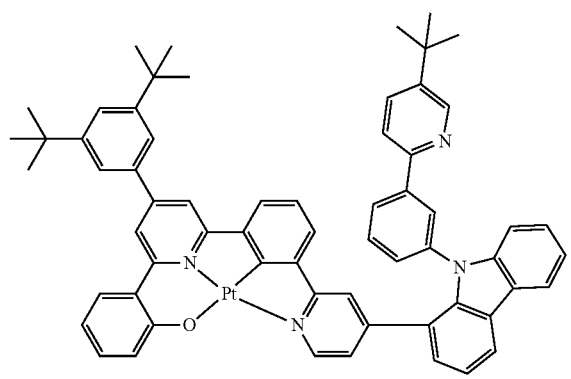
41
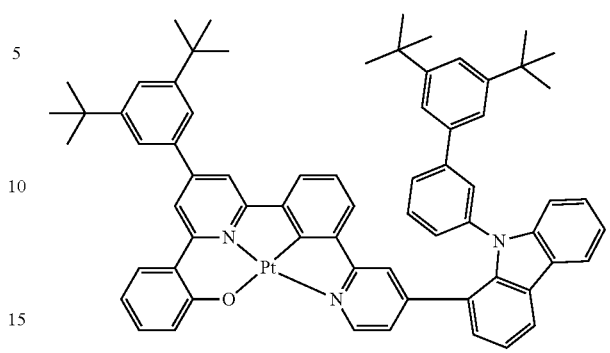
42
43
44
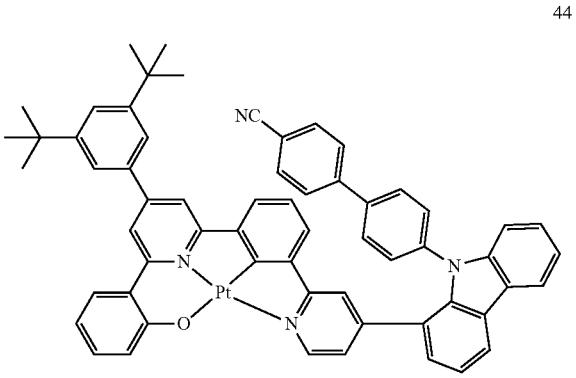

45
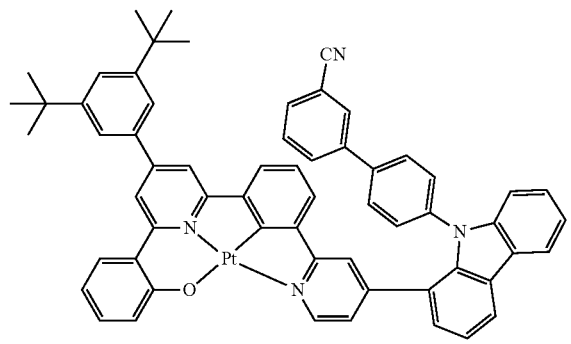
46
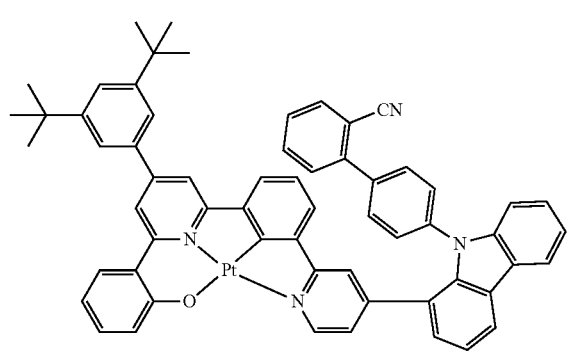
47
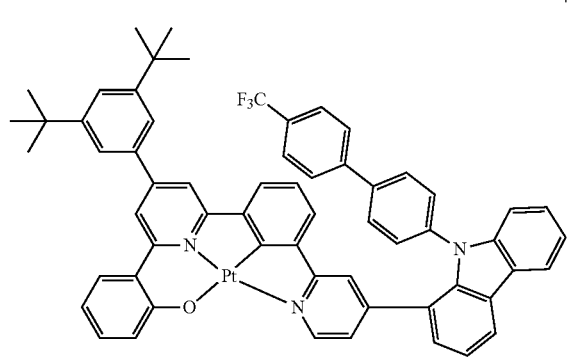
48
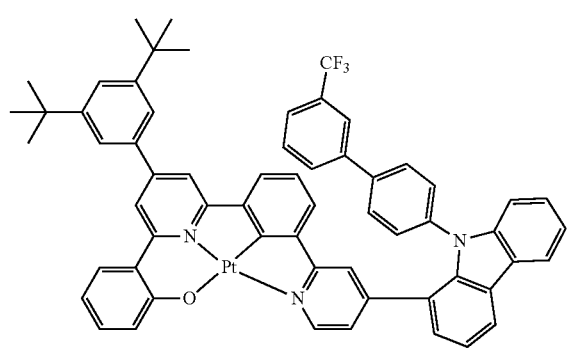
49
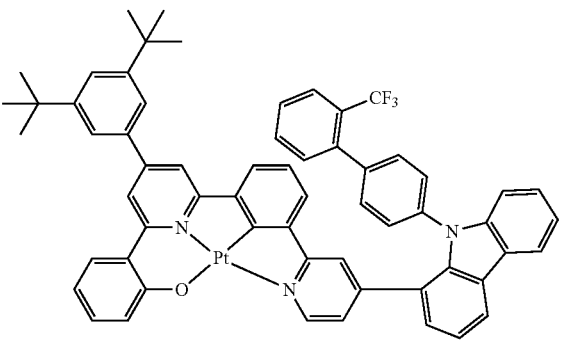
50
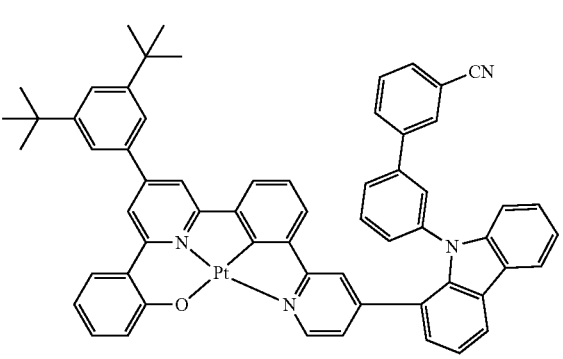
51
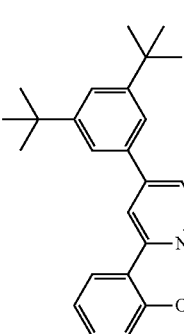
52
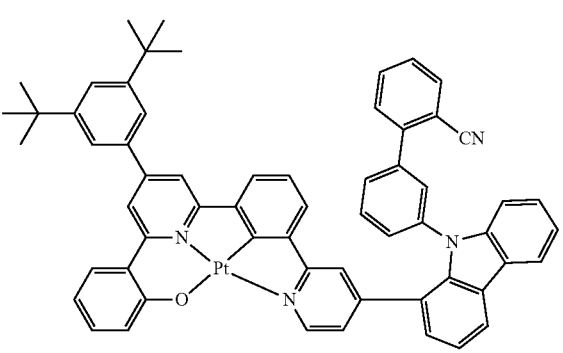

53
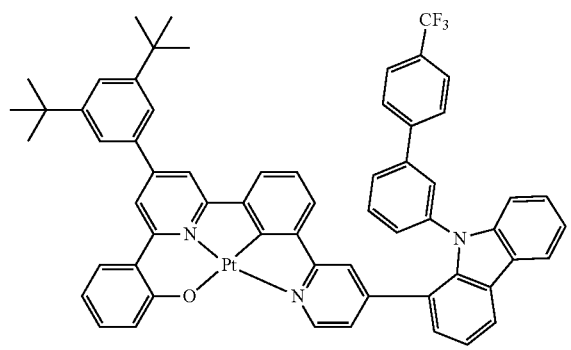
54
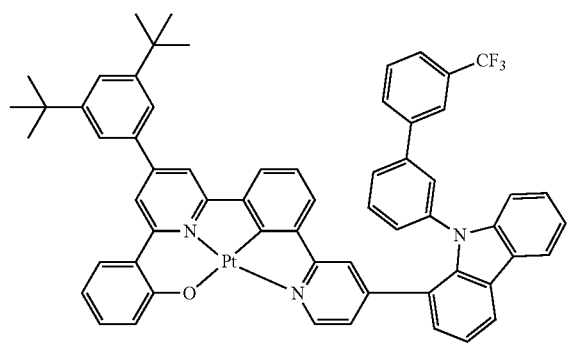
55
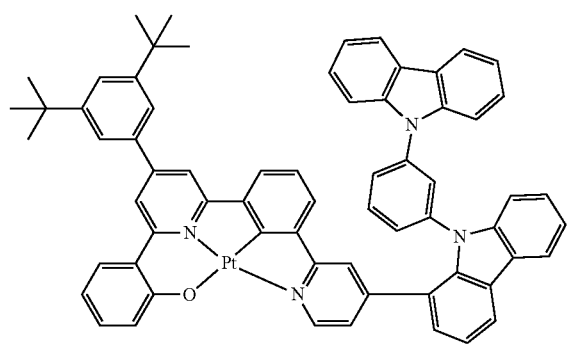
57
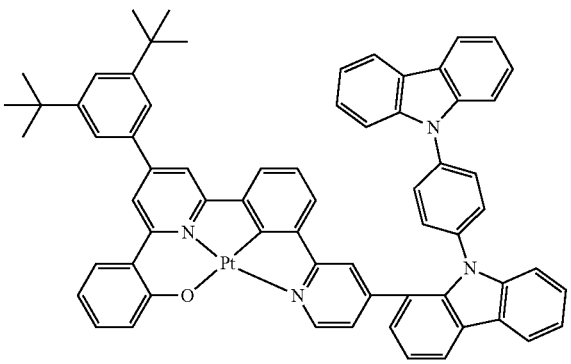
58
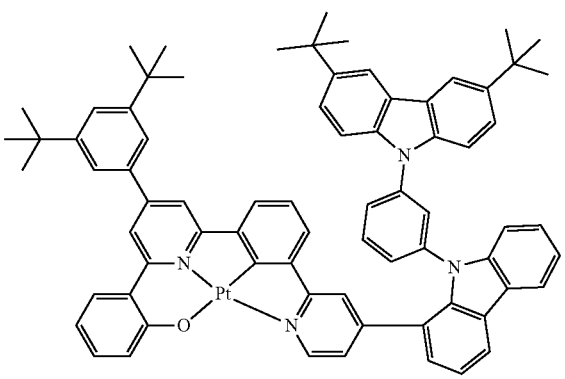
59
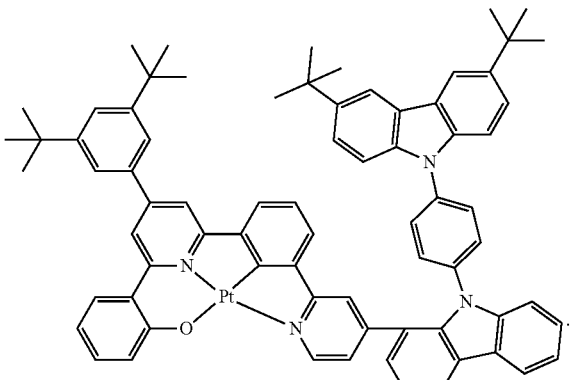

A precursor of the complex has a structure as shown in the following formula:

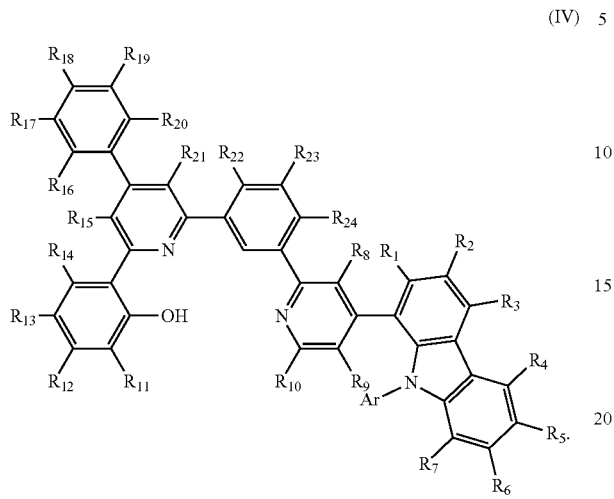

(IV)

A preparation method of the platinum complex includes a preparation route of: subjecting $A_R$ to a coupling reaction with $B_R$ to obtain $C_R$; subjecting the $C_R$ to a demethylation reaction under acidic conditions to obtain $D_R$; subjecting the $D_R$ to a hydroxyl halogenation reaction to obtain $E_R$; subjecting the $E_R$ to a coupling reaction with $F_R$ to obtain $G_R$;

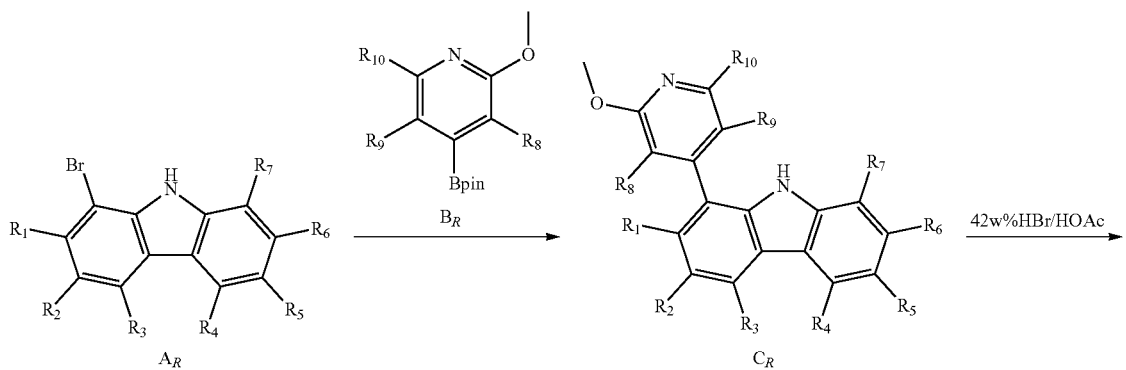

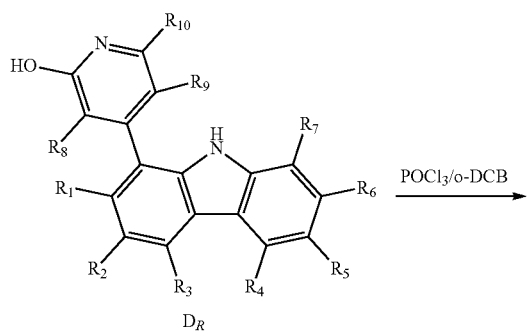

-continued
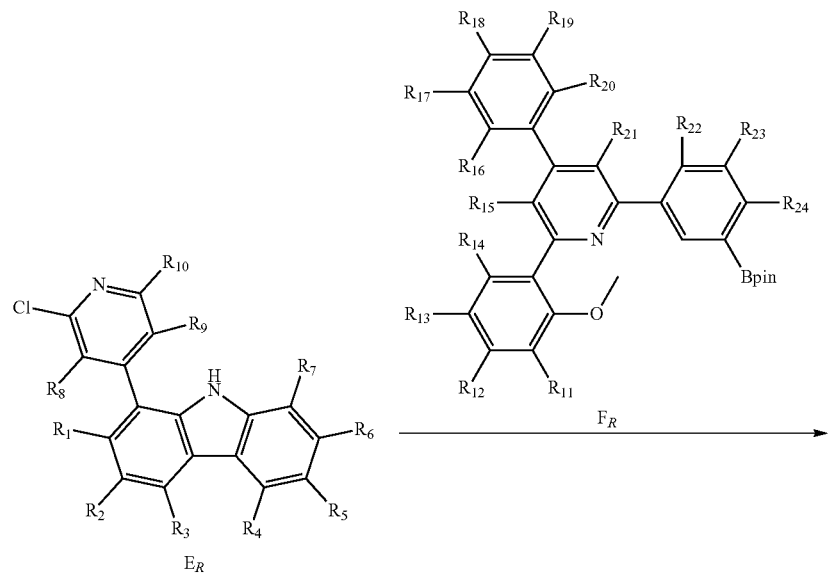
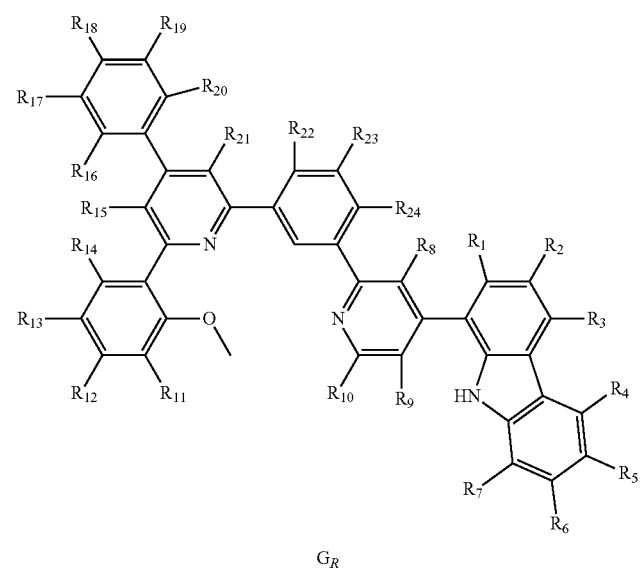

then subjecting the $G_R$ to a coupling reaction with a halogenated aromatic derivative to obtain $H_R$; subjecting the $H_R$ to demethylation under acidic conditions to obtain $I_R$; and finally, subjecting the $I_R$ to an ONCN tetradentate coordination reaction with metal platinum to obtain a $J_R$ type luminescent material,

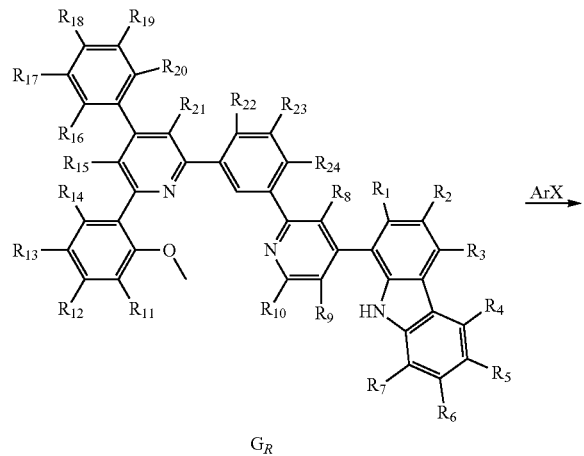

$G_R$

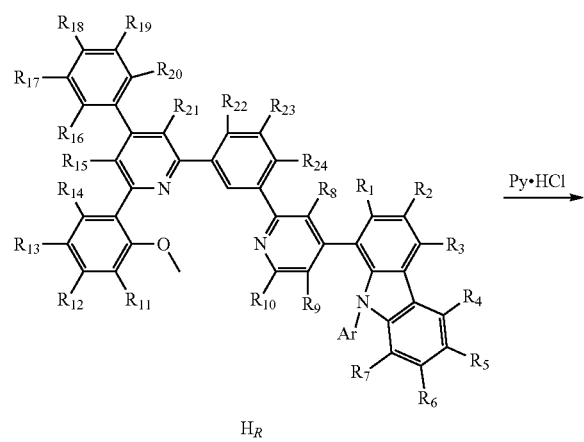

$H_R$

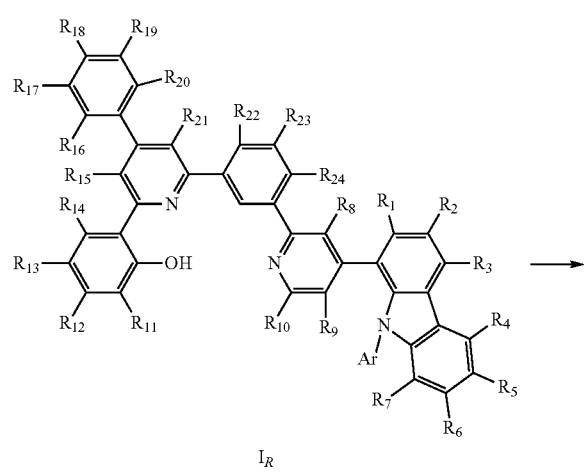

$I_R$

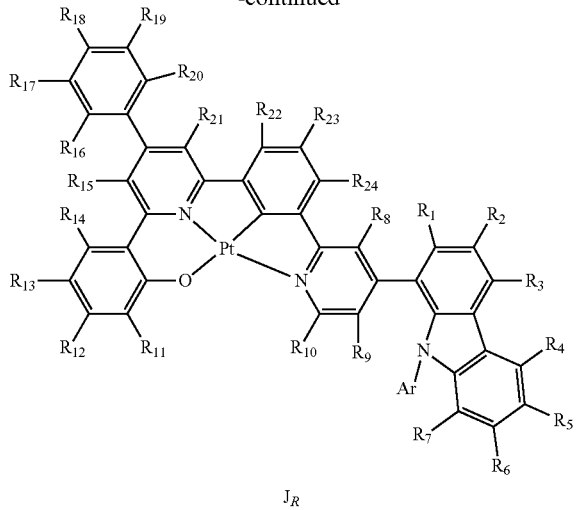

$J_R$

The platinum complex of the present invention is applied as a phosphorescent doping material for a light-emitting layer in an OLED.

By means of the structural design, the present invention improves the heavy atomic effect of phosphorescent materials, enhances spin-spin coupling, and achieves high-efficiency conversion of T1-S0, thereby achieving high luminous efficiency. Moreover, a platinum complex molecule having an ONCN tetradentate ligand has simple synthetic steps and may modifiable sites. The steric hindrance added by the carbazole group contained can effectively reduce the aggregation effect between molecules, avoid the formation of an exciplex, and further improve the color purity and the luminous efficiency.

The organic metal complex in the present invention has high fluorescence quantum efficiency, good thermal stability and low quenching constant, and can be used for manufacturing a green light OLED device having high luminous efficiency.

BRIEF DESCRIPTION OF DRAWINGS

FIG. 1 is a structural diagram of a device of the present invention.

DETAILED DESCRIPTION OF EMBODIMENTS

The present invention is further limited below in conjunction with attached drawings and embodiments.

Example 1: Synthesis of an Intermediate G
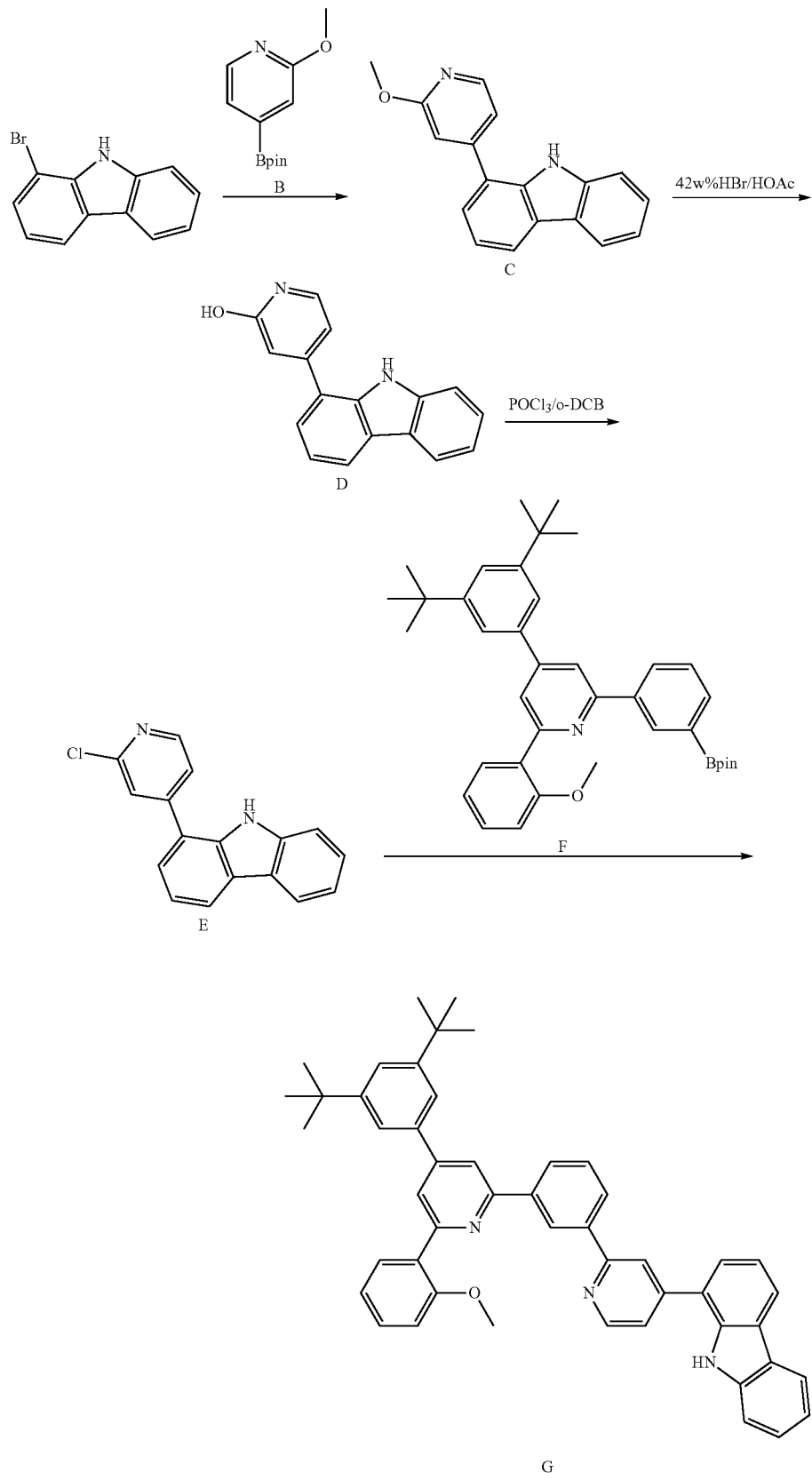

Synthesis of an Intermediate C

A (10.0 g, 40 mmol, 1.0 eq.), B (11.7 g, 50 mmol, 1.25 eq.), Pd$_{132}$ (280 mg, 0.4 mmol, 1% eq.), K$_2$CO$_3$ (13.8 g, 100 mmol, 2.5 eq.), and toluene/ethanol/H$_2$O (200/200/50 ml) were put into a 1,000 ml three-mouth flask, and stirred at 90° C. for a reaction for 12 h under the protection of nitrogen. After the reaction was completed, most of a reaction solution was spin-dried, deionized water was added, and extraction was conducted with dichloromethane for three times. Then, spin-drying was conducted, and treatment was conducted with a silica gel column (with a mixture of Hex and EA at a ratio of 10:1). Finally, 21.0 g of a brown solid with a yield of 94.2% was obtained. Hydrogen spectrum data are as follows:

$^1$H NMR (400 MHz, CDCl$_3$) δ 8.52 (s, 1H), 8.31 (d, J=5.2 Hz, 1H), 8.16-8.07 (m, 2H), 7.46 (dd, J=9.1, 2.6 Hz, 3H), 7.31 (s, 1H), 7.28 (s, 1H), 7.20 (dd, J=5.3, 1.4 Hz, 1H), 7.08 (s, 1H), 4.03 (s, 3H).

Synthesis of an Intermediate D

The C (2.0 g, 7.2 mmol, 1.0 eq.), pyridine hydrochloride (10 g, mass ratio: 5), and o-DCB (2 ml) were put into a 250 ml one-mouth flask, and stirred at 180° C. for a reaction for 3.5 h under the protection of nitrogen. After the reaction was completed, cooling was conducted to room temperature, and water and dichloromethane were added and stirred for 30 min to realize liquid layering. Then, an organic layer was collected to obtain a crude product, and the crude product was subjected to beating with Hex to obtain 2.0 g of a yellow solid with a yield of 100%.

$^1$H NMR (400 MHz, DMSO) δ 11.22 (s, 1H), 8.15 (dd, J=18.5, 7.7 Hz, 2H), 7.59-7.52 (m, 2H), 7.46-7.36 (m, 2H), 7.24 (t, J=7.6 Hz, 1H), 7.20-7.13 (m, 1H), 6.67 (d, J=1.2 Hz, 1H), 6.52 (dd, J=6.7, 1.7 Hz, 1H).

Synthesis of an Intermediate E

The intermediate D was taken, and POCl$_3$ (10 mL) and O-DCB (1 ml) were added for a reaction at 100° C. for 18 h under the protection of nitrogen. After the reaction was completed, cooling was conducted to room temperature. Part of the POCl$_3$ was subjected to rotary evaporation until a sticky state was reached, and then ice water was added and stirred for completely quenching the POCl$_3$. Then, a resulting reaction solution was extracted with dichloromethane to obtain a crude product, and the crude product was subjected to beating with Hex to obtain 2.0 g of a yellow solid with a yield of 100%. Hydrogen spectrum data are as follows: $^1$H NMR (400 MHz, CDCl$_3$) δ 8.59 (s, 1H), 8.49 (dd, J=5.1, 0.6 Hz, 1H), 8.14 (dd, J=17.2, 7.5 Hz, 2H), 7.70-7.65 (m, 1H), 7.55 (dd, J=5.1, 1.5 Hz, 1H), 7.53-7.42 (m, 3H), 7.35 (t, J=7.6 Hz, 1H), 7.32-7.27 (m, 1H).

Synthesis of an Intermediate G

The E (6.0 g, 21.5 mmol, 1.0 eq.), an intermediate F (13.5 g, 23.5 mmol, 1.1 eq.) (a method for synthesis and preparation of the intermediate F refers to the patent CN110872325A), Pd$_2$(dba)$_3$ (2.15 g, 10% eq.), X-phos (2.15 g, 20% eq.), K$_3$PO$_4$·3H$_2$O (17 g, 3.0 eq.), and toluene/ethanol/H$_2$O (100/60/40 ml) were put into a 250 ml one-mouth flask, and subjected to a reaction at 110° C. for 12 h under the protection of nitrogen. After the reaction was completed, cooling was conducted to room temperature. Suction filtration was conducted to obtain a filtrate, and rotary evaporation was conducted to remove the toluene/ethanol. Then, a resulting reaction solution was extracted, a DCM layer was combined, and separation was conducted with a silica gel column (with a mixture of Hex and EA at a ratio of 5:1) to obtain 8 g of a brownish white solid with a yield of 51.6% and an HPLC purity of 99.15%. Hydrogen spectrum data are as follows: $^1$H NMR (400 MHz, CDCl$_3$) δ 8.85 (d, J=4.6 Hz, 1H), 8.80 (s, 1H), 8.68 (s, 1H), 8.22 (d, J=7.9 Hz, 1H), 8.14 (dd, J=13.8, 8.3 Hz, 4H), 8.05-7.99 (m, 2H), 7.92 (d, J=1.4 Hz, 1H), 7.67-7.51 (m, 7H), 7.43-7.36 (m, 4H), 7.26 (s, 1H), 7.06 (dd, J=15.3, 7.9 Hz, 2H), 3.88 (s, 3H), 1.42 (s, 18H).

Example 2: Synthesis of a Complex 2

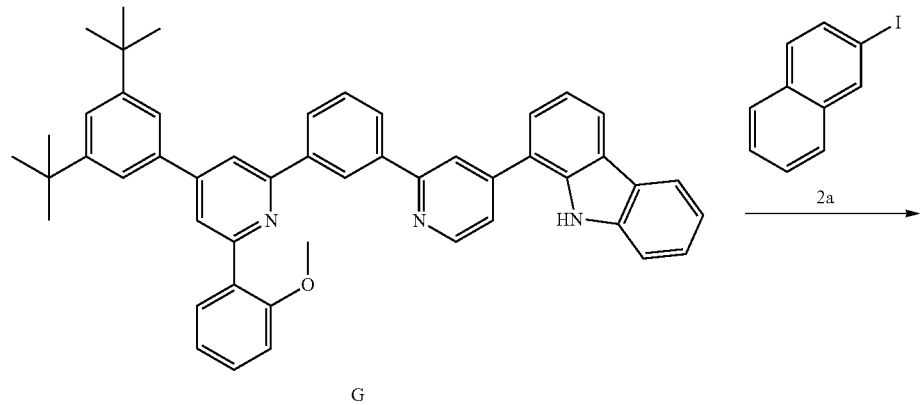

G

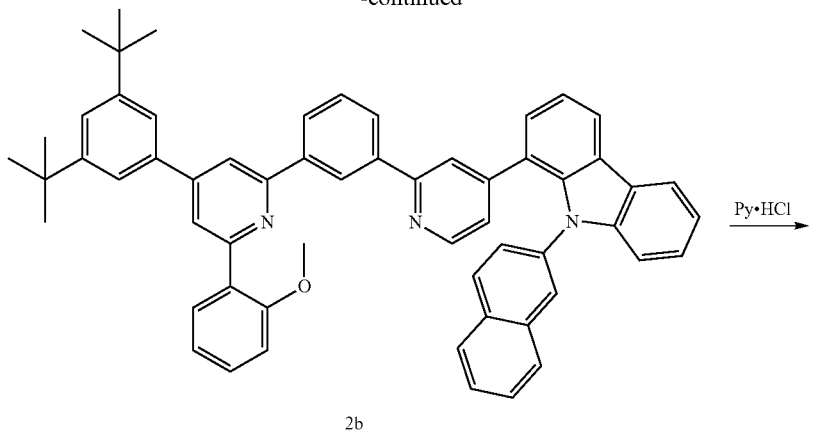

2b

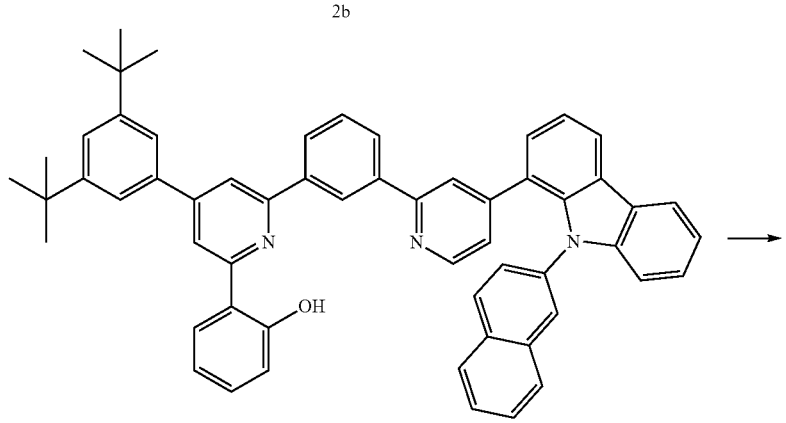

2c

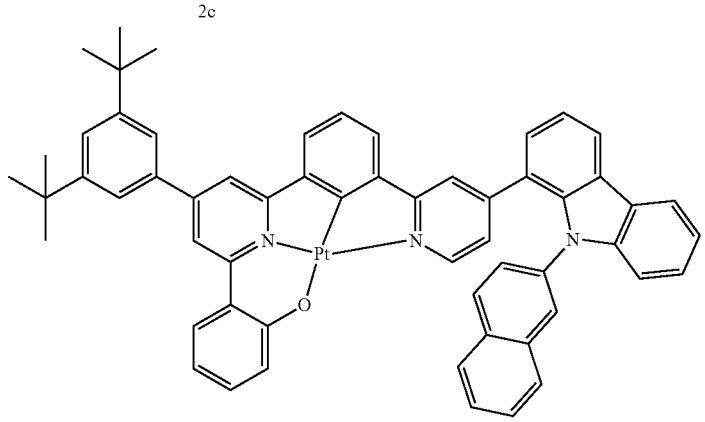

Complex 2

Synthesis of an Intermediate 2b

The G (5.0 g, 1.0 eq), 2-iodonaphthalene (5.50 g, 3.0 eq), Cu (230 mg, 0.5 eq), CuI (688 mg, 0.5 eq), 1,10-phenanthroline (1.30 g, 1.0 eq), and cesium carbonate (7.06 g, 3.0 eq) were added into a 250 ml three-mouth flask, and subjected to a reaction at an oil bath temperature of 160° C. for 3 d under the protection of nitrogen with 100 ml of anhydrous xylene as a reaction solvent. After the reaction was completed, cooling was conducted to room temperature. Then, a resulting reaction solution was directly subjected to suction filtration with EA as an eluent to remove an inorganic salt, and chromatography was conducted with a silica gel column (with a mixture of hex and EA at a ratio of 8:1 as a chromatography solution) to obtain 3.8 g of a yellow fluorescent product point by collection. Hydrogen spectrum data are as follows: $^1$H NMR (400 MHz, CDCl$_3$) δ 8.30 (dd, J=5.9, 3.1 Hz, 1H), 8.24 (d, J=8.2 Hz, 2H), 8.18 (s, 2H), 8.07 (d, J=4.1 Hz, 2H), 7.89 (s, 1H), 7.59 (t, J=5.1 Hz, 6H), 7.48 (d, J=8.6 Hz, 2H), 7.45-7.30 (m, 8H), 7.29 (s, 1H), 7.17 (s, 2H), 7.06 (dd, J=8.7, 5.1 Hz, 3H), 3.91 (s, 3H), 1.43 (s, 18H).

Synthesis of an Intermediate 2c

The 2b (3.0 g), pyridine hydrochloride (30.0 g), and o-dichlorobenzene (3.0 ml) were added into a 100 ml one-mouth flask, and subjected to a reaction at an oil bath temperature of 200° C. for 8 h under the protection of nitrogen. After the reaction was completed, cooling was conducted to room temperature. Dissolution was conducted with a large amount of water, and extraction was conducted with DCM for three times. Then, an organic phase was spin-dried and subjected to chromatography with a silica gel column (with a mixture of hex and EA at a ratio of 10:1 as a chromatography solution) to obtain 2.8 g of a light yellow product. Hydrogen spectrum data are as follows: $^1$H NMR (400 MHz, CDCl$_3$) δ 8.31-8.28 (m, 1H), 8.23 (d, J=7.2 Hz, 2H), 8.06 (s, 1H), 7.98 (t, J=7.3 Hz, 3H), 7.83 (s, 1H), 7.62-7.53 (m, 6H), 7.51-7.28 (m, 11H), 7.22 (s, 2H), 7.11 (d, J=4.6 Hz, 1H), 7.00 (d, J=10.9 Hz, 2H), 1.43 (d, J=2.2 Hz, 18H).

Synthesis of a Complex 2

The 2c (100 mg, 0.124 mmol), K$_2$PtCl$_4$ (70 mg, 0.167 mmol), 18-crown-6-ether (6 mg, 0.012 mmol), and acetic acid (5 mL) were put into a 250 ml one-mouth flask, and subjected to a reaction at 130° C. for 48 h under the protection of nitrogen. After the reaction was completed, an excessive amount of deionized water was added to precipitate out a solid. Then suction filtration was conducted, and a solid was dissolved in dichloromethane, spin-dried, and subjected to treatment with a silica gel column (with a mixture of Hex, DCM and EA at a ratio of 20:20:1). After the treatment with the column, a resulting product was subjected to recrystallization with a mixture of dichloromethane and n-hexane at a ratio of 1:4. 80 mg of a red solid was obtained. Hydrogen spectrum data are as follows: $^1$H NMR (400 MHz, CDCl$_3$) δ 8.56 (s, 1H), 8.35-8.27 (m, 2H), 8.24 (d, J=7.6 Hz, 1H), 8.10 (d, J=7.3 Hz, 1H), 7.73 (s, 1H), 7.63 (d, J=11.9 Hz, 4H), 7.52-7.45 (m, 4H), 7.41 (dd, J=17.2, 5.8 Hz, 5H), 7.38-7.32 (m, 3H), 7.13 (dd, J=15.0, 9.3 Hz, 4H), 6.99 (dd, J=18.3, 10.4 Hz, 3H), 6.77 (t, J=6.9 Hz, 1H), 1.45 (d, J=12.3 Hz, 18H).

Example 3: Synthesis of a Complex 19

Synthesis of a Complex 19

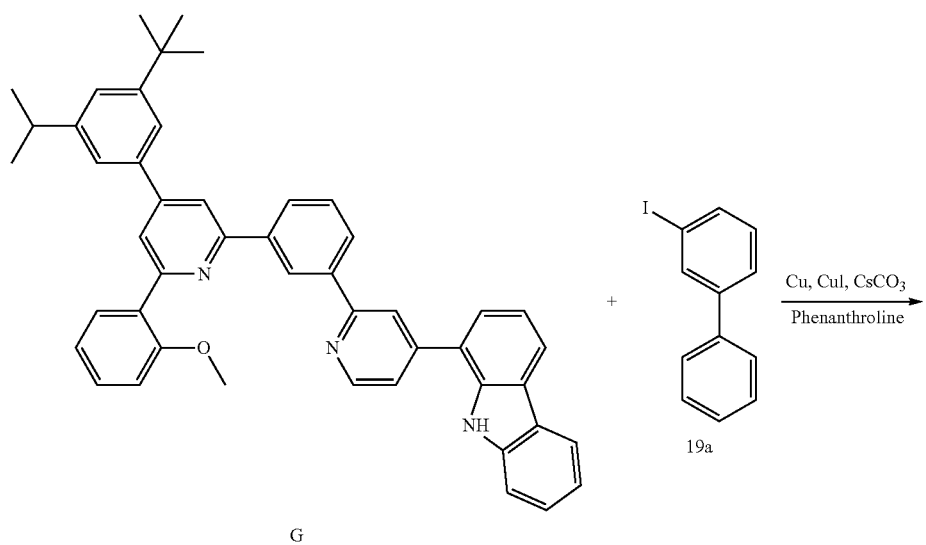

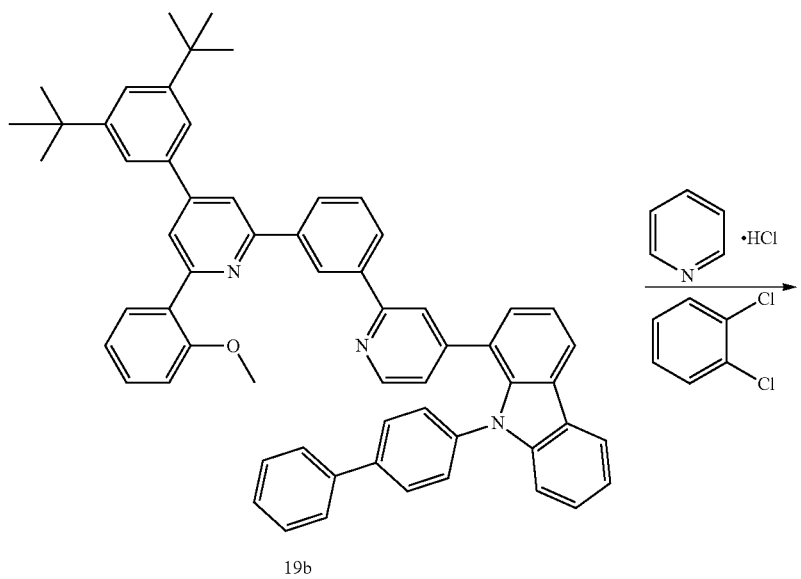

-continued

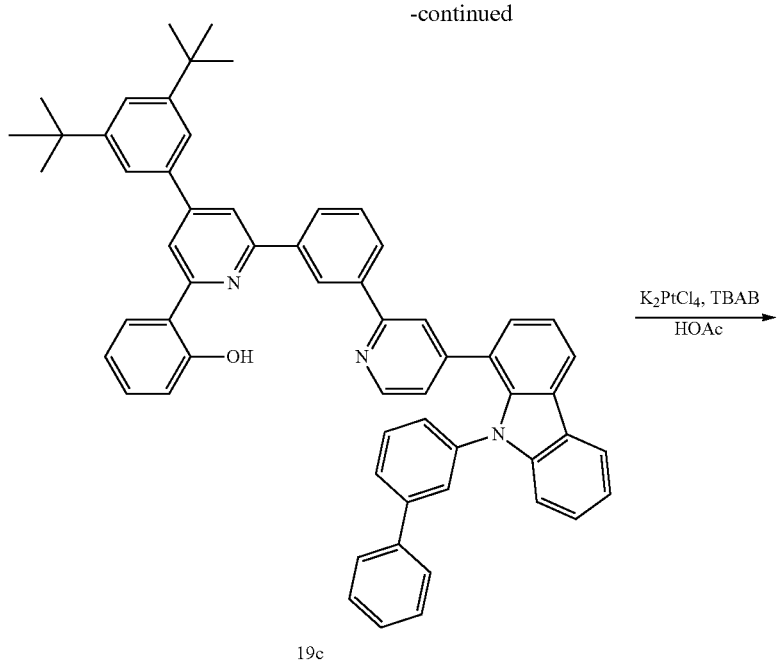

19c

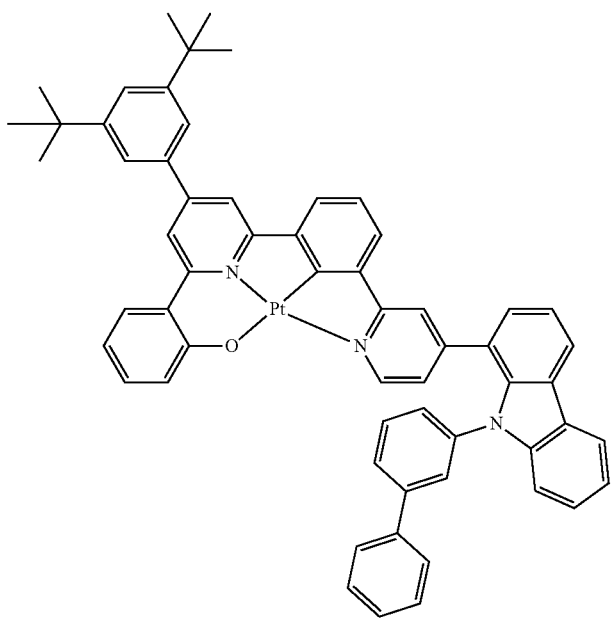

Complex 19

Synthesis of an Intermediate 19b

The intermediate G (2.5 g, 3.61 mmol), 19a (2.02 g, 7.22 mmol), Cu (115 mg, 1.81 mmol), CuI (345 mg, 1.81 mmol), $CsCO_3$ (3.53 g, 10.83 mmol), phenanthroline (651 mg, 3.61 mmol), and xylene (50 ml) were put into a 250 ml three-mouth flask, and stirred for a reaction at 160° C. for 30 h under the protection of nitrogen. After the reaction was completed, suction filtration was directly conducted, elution was conducted with EA, and spin drying was conducted to obtain a brown solid. Then, the brown solid was treated with a silica gel column (with a mixture of Hex and EA at a ratio of 5:1) to obtain 2.2 g of a white solid. Hydrogen spectrum data are as follows:

1H NMR (400 MHz, $CDCl_3$) δ 8.49 (s, 1H), 8.42 (d, J=4.9 Hz, 1H), 8.27 (dd, J=5.5, 3.5 Hz, 1H), 8.19 (dd, J=14.2, 7.7 Hz, 2H), 8.01 (d, J=6.4 Hz, 2H), 7.90 (d, J=7.7 Hz, 1H), 7.84 (d, J=1.1 Hz, 1H), 7.57-7.47 (m, 4H), 7.46 (s, 1H), 7.38 (ddd, J=22.4, 10.0, 5.3 Hz, 5H), 7.28 (d, J=8.1 Hz, 1H), 7.22-7.07 (m, 9H), 7.03 (t, J=7.7 Hz, 2H), 3.87 (s, 3H), 1.40 (s, 18H).

Synthesis of an Intermediate 19c

The 19b (3.8 g, 4.5 mmol), pyridine hydrochloride (38 g), and 3.8 mL of o-dichlorobenzene were put into a 500 ml one-mouth flask, and subjected to a reaction at 200° C. for 8 h under the protection of nitrogen. After the reaction was completed, extraction was conducted with dichloromethane for two times, spin-drying was conducted, and treatment was conducted with a silica gel column (with a mixture of Hex, DCM and EA at a ratio of 15:15:1). Then, a resulting crude product was subjected to recrystallization with ethyl acetate/methanol. 2.9 g of a light yellow solid was obtained. Hydrogen spectrum data are as follows:

1H NMR (400 MHz, CDCl$_3$) δ 8.45 (d, J=4.9 Hz, 1H), 8.31 (s, 1H), 8.28 (dd, J=6.1, 2.9 Hz, 1H), 8.22 (d, J=7.7 Hz, 1H), 8.02 (s, 2H), 7.95 (d, J=7.1 Hz, 1H), 7.86 (d, J=7.8 Hz, 1H), 7.77 (s, 1H), 7.59 (s, 1H), 7.56-7.48 (m, 3H), 7.47-7.39 (m, 4H), 7.33 (dd, J=9.9, 7.5 Hz, 4H), 7.15 (qd, J=13.8, 7.0 Hz, 10H), 6.97 (t, J=7.3 Hz, 2H), 1.42 (s, 18H).

Synthesis of a Complex 19

The 19c (426 mg, 0.513 mmol), K$_2$PtCl$_4$ (256 mg, 0.616 mmol), TBAB (16.5 mg, 0.051 mmol), and acetic acid (42.6 mL) were put into a 250 ml one-mouth flask, and subjected to a reaction at 130° C. for 48 h under the protection of nitrogen. After the reaction was completed, an excessive amount of deionized water was added to precipitate out a solid. Then suction filtration was conducted, and a solid was dissolved in dichloromethane, spin-dried, and subjected to treatment with a silica gel column (with a mixture of Hex, DCM and EA at a ratio of 20:20:1). After the treatment with the column, a resulting product was subjected to recrystallization with a mixture of dichloromethane and n-hexane at a ratio of 1:4. 380 mg of a red solid was obtained. Hydrogen spectrum data are as follows:

1H NMR (400 MHz, CDCl$_3$) δ 8.84 (d, J=5.3 Hz, 1H), 8.40-8.27 (m, 2H), 8.23 (d, J=7.5 Hz, 1H), 8.13 (d, J=7.3 Hz, 1H), 7.72 (d, J=1.6 Hz, 1H), 7.64 (dd, J=6.7, 1.6 Hz, 3H), 7.55-7.30 (m, 8H), 7.24 (d, J=1.9 Hz, 1H), 7.20 (t, J=7.4 Hz, 5H), 7.15-7.01 (m, 4H), 6.78 (dt, J=8.3, 6.0 Hz, 4H), 1.47 (s, 18H).

Example 4: Synthesis of a Complex 20

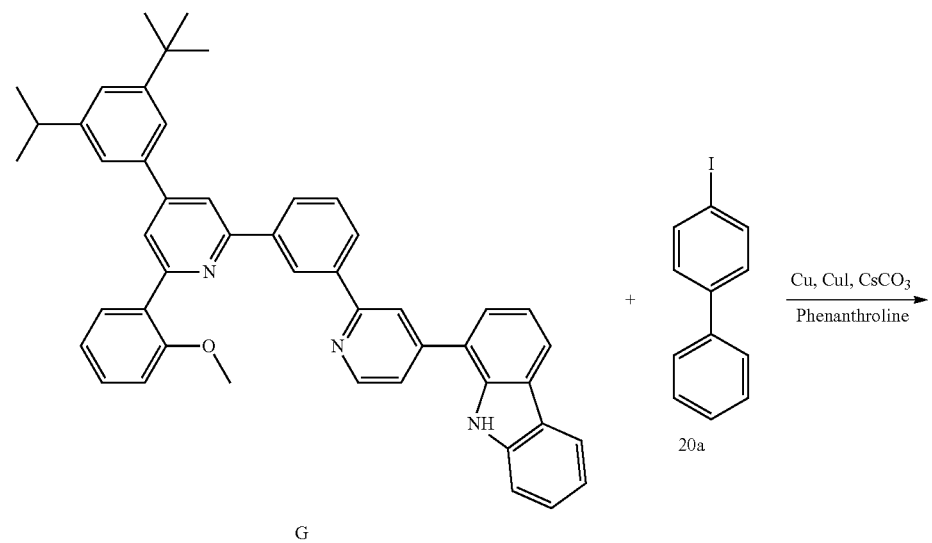

G

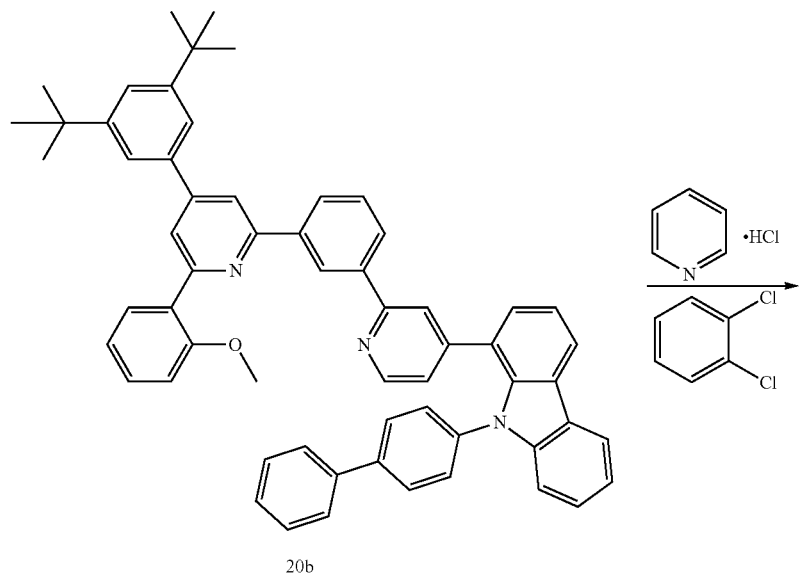

20b

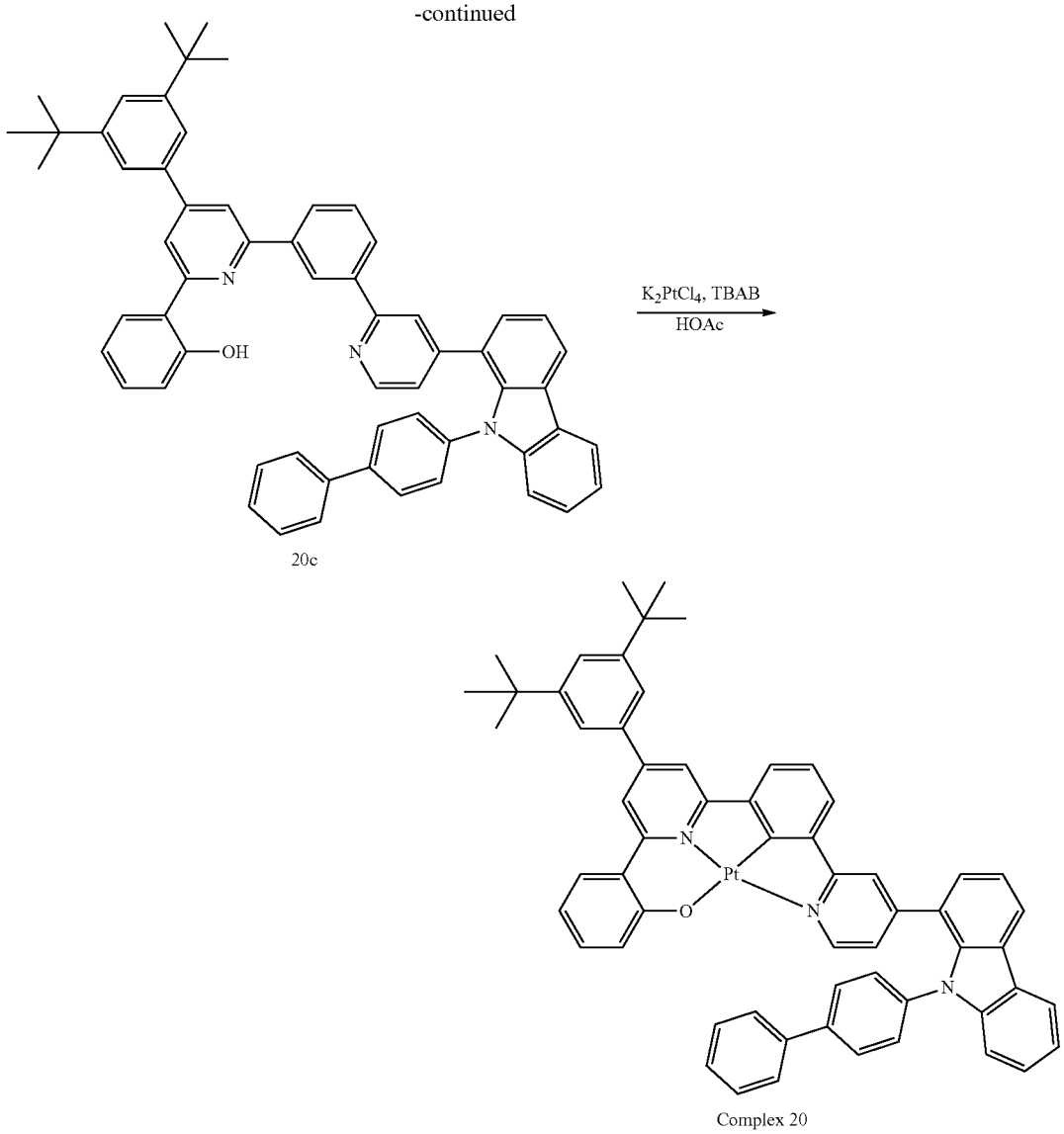

Complex 20

Synthesis of an Intermediate 20b

The intermediate G (2.5 g, 3.61 mmol), 20a (2.02 g, 7.22 mmol), Cu (115 mg, 1.81 mmol), CuI (345 mg, 1.81 mmol), $CsCO_3$ (3.53 g, 10.83 mmol), phenanthroline (651 mg, 3.61 mmol), and xylene (50 ml) were put into a 250 ml three-mouth flask, and stirred for a reaction at 160° C. for 30 h under the protection of nitrogen. After the reaction was completed, suction filtration was directly conducted, elution was conducted with EA, and spin drying was conducted to obtain a brown solid. Then, the brown solid was treated with a silica gel column (with a mixture of Hex and EA at a ratio of 5:1) to obtain 2.2 g of a white solid. Hydrogen spectrum data are as follows:

1H NMR (400 MHz, $CDCl_3$) δ 8.49 (s, 1H), 8.42 (d, J=4.9 Hz, 1H), 8.27 (dd, J=5.5, 3.5 Hz, 1H), 8.19 (dd, J=14.2, 7.7 Hz, 2H), 8.01 (d, J=6.4 Hz, 2H), 7.90 (d, J=7.7 Hz, 1H), 7.84 (d, J=1.1 Hz, 1H), 7.57-7.47 (m, 4H), 7.46 (s, 1H), 7.38 (ddd, J=22.4, 10.0, 5.3 Hz, 5H), 7.28 (d, J=8.1 Hz, 1H), 7.22-7.07 (m, 9H), 7.03 (t, J=7.7 Hz, 2H), 3.87 (s, 3H), 1.40 (s, 18H).

Synthesis of an Intermediate 20c

The 20b (3.8 g, 4.5 mmol), pyridine hydrochloride (38 g), and 3.8 mL of o-dichlorobenzene were put into a 500 ml one-mouth flask, and subjected to a reaction at 200° C. for 8 h under the protection of nitrogen. After the reaction was completed, extraction was conducted with dichloromethane for two times, spin-drying was conducted, and treatment was conducted with a silica gel column (with a mixture of Hex, DCM and EA at a ratio of 15:15:1). Then, a resulting crude product was subjected to recrystallization with ethyl acetate/methanol. 2.9 g of a light yellow solid was obtained. Hydrogen spectrum data are as follows:

1H NMR (400 MHz, $CDCl_3$) δ 8.45 (d, J=4.9 Hz, 1H), 8.31 (s, 1H), 8.28 (dd, J=6.1, 2.9 Hz, 1H), 8.22 (d, J=7.7 Hz, 1H), 8.02 (s, 2H), 7.95 (d, J=7.1 Hz, 1H), 7.86 (d, J=7.8 Hz, 1H), 7.77 (s, 1H), 7.59 (s, 1H), 7.56-7.48 (m, 3H), 7.47-7.39 (m, 4H), 7.33 (dd, J=9.9, 7.5 Hz, 4H), 7.15 (qd, J=13.8, 7.0 Hz, 10H), 6.97 (t, J=7.3 Hz, 2H), 1.42 (s, 18H).

Synthesis of a Complex 20

The 20c (426 mg, 0.513 mmol), K$_2$PtCl$_4$ (256 mg, 0.616 mmol), TBAB (16.5 mg, 0.051 mmol), and acetic acid (42.6 mL) were put into a 250 ml one-mouth flask, and subjected to a reaction at 130° C. for 48 h under the protection of nitrogen. After the reaction was completed, an excessive amount of deionized water was added to precipitate out a solid. Then suction filtration was conducted, and a solid was dissolved in dichloromethane, spin-dried, and subjected to treatment with a silica gel column (with a mixture of Hex, DCM and EA at a ratio of 20:20:1). After the treatment with the column, a resulting product was subjected to recrystallization with a mixture of dichloromethane and n-hexane at a ratio of 1:4. 380 mg of a red solid was obtained. Hydrogen spectrum data are as follows:

1H NMR (400 MHz, CDCl$_3$) δ 8.84 (d, J=5.3 Hz, 1H), 8.40-8.27 (m, 2H), 8.23 (d, J=7.5 Hz, 1H), 8.13 (d, J=7.3 Hz, 1H), 7.72 (d, J=1.6 Hz, 1H), 7.64 (dd, J=6.7, 1.6 Hz, 3H), 7.55-7.30 (m, 8H), 7.24 (d, J=1.9 Hz, 1H), 7.20 (t, J=7.4 Hz, 5H), 7.15-7.01 (m, 4H), 6.78 (dt, J=8.3, 6.0 Hz, 4H), 1.47 (s, 18H).

Luminous Properties of Compounds:

| Complex | Absorption spectrum λ/nm | Emission spectrum (dichloromethane solution) λ/nm |
|---|---|---|
| Complex 2 | 237.5, 286.6, 357.4 | 518 |
| Complex 19 | 243, 285.5, 381.3 | 517 |
| Complex 20 | 242, 286.9, 383 | 516.5 |

An application example of the compound of the present invention is described below.

A preparation method of a device is as follows.

First, a transparent conductive ITO glass substrate 10 (with an anode 20 on the surface) was sequentially washed with a detergent solution, deionized water, ethanol, acetone and deionized water, and then treated with oxygen plasma for 300 s.

Then, HATCN was evaporated on the ITO to serve as a hole injection layer 30 having a thickness of 3 nm.

Then, a TAPC compound was evaporated to form a hole transport layer 40 having a thickness of 50 nm.

Then, a guest complex (9%) and host TCTA (91%) were evaporated on the hole transport layer to serve as a light-emitting layer 50 having a thickness of 7 nm.

Then, a guest complex (9%) and host TCTA (91%) were evaporated on the hole transport layer to serve as a light-emitting layer 60 having a thickness of 3 nm.

Then, TmPyPb was evaporated on the light-emitting layer to serve as a hole blocking layer 70 having a thickness of 50 nm.

Finally, LiF was evaporated to serve as an electron injection layer 80 having a thickness of 0.8 nm, and Al was evaporated to serve as a device cathode 80 having a thickness of 100 nm.

Structural formulas used in the device are as follows.

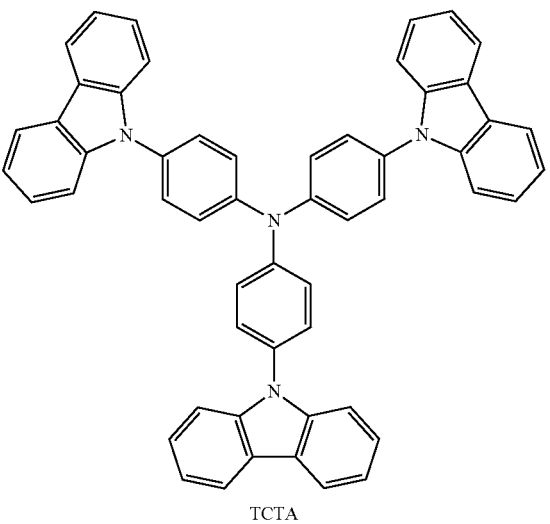

TCTA

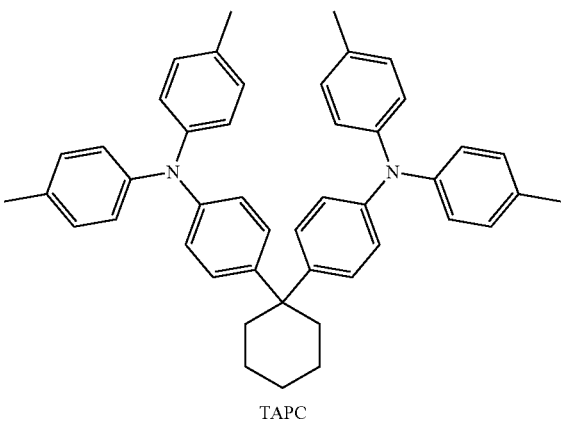

TAPC

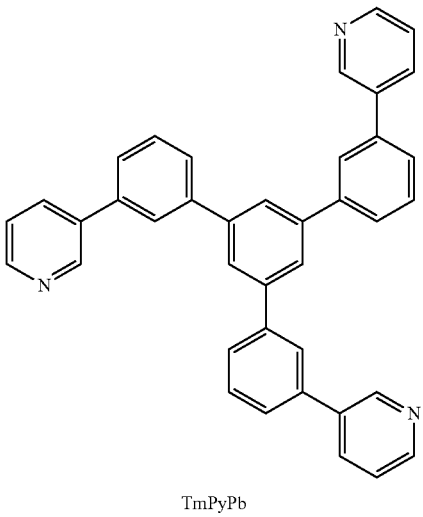

TmPyPb

-continued

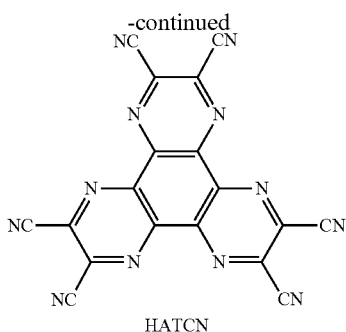

HATCN
Ref-1

Ref-2

Device results are as follows.

Device properties of organic electroluminescent devices in Comparative Example 1 and Comparative Example 2 at a current density of 20 mA/cm² are listed in Table 1.

TABLE 1

| Device number | Complex | Driving voltage | Luminous efficiency | Device service life (LT95) |
|---|---|---|---|---|
| Comparative Example 1 | Ref-1 | 1.1 | 0.91 | 0.30 |
| Comparative Example 2 | Ref-2 | 1.1 | 0.87 | 0.18 |
| Example 5 | Complex 2 | 1.1 | 0.90 | 0.56 |
| Example 6 | Complex 19 | 1 | 1 | 0.8 |
| Example 7 | Complex 20 | 1 | 1 | 1 |

Note:
A device property test is carried out on the basis of Example 7, and each index is set as 1; and LT95 indicates the corresponding time when the brightness of a device is reduced to 95% of the initial brightness (10,000 cd/m²).

The organic metal complex in the present invention maintains good high quantum efficiency, slightly reduces the driving voltage of a device, and improves the luminous efficiency. However, compared with the LT95 in comparative examples, the device service life in examples is significantly and essentially prolonged. Data of the series of devices show that when the ONCN complex containing carbazole is used as a phosphorescent luminescent ligand material, a green light OLED device having high luminous efficiency can be manufactured and have an extremely long service life.

The various embodiments described above are merely used as examples, and are not intended to limit the scope of the present invention. On the premise of not departing from the spirit of the present invention, a variety of materials and structures in the present invention can be replaced with other materials and structures. It shall be understood that many modifications and changes can be made by a person skilled in the art without creative effort according to the concept of the present invention. Therefore, all technical solutions that can be obtained by a person skilled in the art through analysis, reasoning or partial research on the basis of the prior art shall fall within the protection scope as defined by this application.

The invention claimed is:

1. A platinum complex having an ONCN tetradentate ligand and containing carbazole, having a structure as shown in a formula (I):

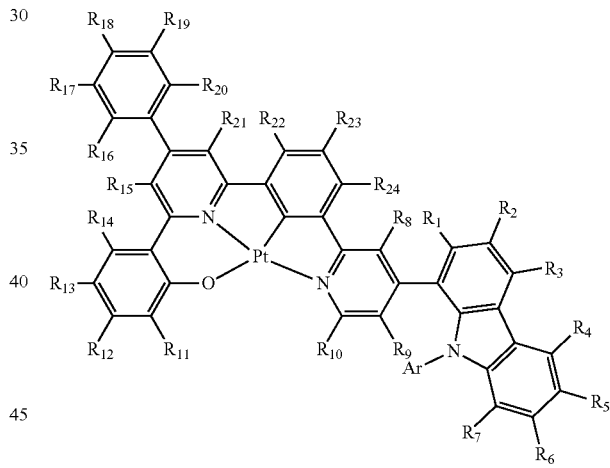

(I)

wherein $R_1$-$R_{24}$ are independently selected from hydrogen, deuterium, sulfur, halogen, hydroxyl, acyl, alkoxyl containing 1-30 C atoms, acyloxyl, amino, nitro, acylamino, cyano, carboxyl, styrenyl, aminoformyl, benzylcarbonyl, aryloxyl, diarylamino, saturated alkyl containing 1-30 C atoms, substituted or unsubstituted aryl containing 6-30 C atoms, and substituted or unsubstituted heteroaryl containing 5-30 C atoms, or adjacent groups of the $R_1$-$R_{24}$ are connected to each other through a covalent bond to form a ring;

Ar is selected from substituted or unsubstituted aryl containing 6-30 carbon atoms, and substituted or unsubstituted heteroaryl containing 3-30 carbon atoms; and the "substituted" refers to substitution with deuterium, halogen, amino, nitro, cyano, or $C_1$-$C_4$ alkyl.

2. The platinum complex according to claim 1, wherein the $R_1$-$R_{24}$ are independently selected from hydrogen, deuterium, sulfur, halogen, alkoxyl containing 1-10 C atoms, cyano, styrenyl, aryloxyl, diarylamino, saturated alkyl containing 1-10 C atoms, substituted or unsubstituted aryl containing 6-20 C atoms, and substituted or unsubstituted heteroaryl containing 5-20 C atoms, or adjacent groups of the $R_1$-$R_{24}$ are connected to each other through a covalent bond to form a ring.

3. The platinum complex according to claim 2, wherein the Ar is selected from substituted or unsubstituted 2,3- or 3,4-benzoaryl containing 6-30 carbon atoms, substituted or unsubstituted 2,3- or 3,4-benzoheteroaryl containing 3-30 carbon atoms, substituted or unsubstituted phenylaryl containing 6-20 carbon atoms, and substituted or unsubstituted phenylheteroaryl containing 6-20 carbon atoms.

4. A platinum complex having an ONCN tetradentate ligand and containing, having a structure as shown in a formula (II) or (III):

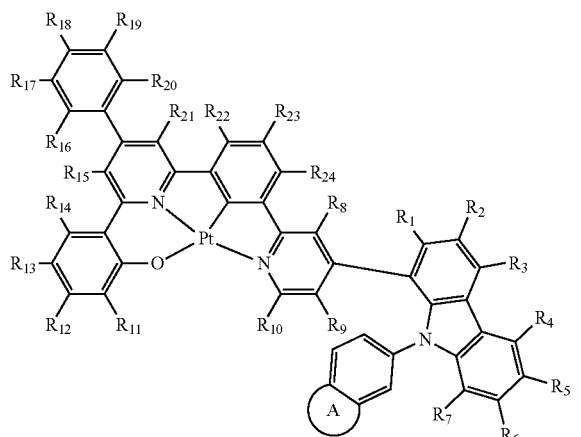

wherein $R_1$-$R_{24}$ are independently selected from hydrogen, deuterium, halogen, cyano, aryloxyl, diarylamino, saturated alkyl containing 1-4 C atoms, substituted or unsubstituted aryl containing 6-10 C atoms, and substituted or unsubstituted heteroaryl containing 5-10 C atoms, or adjacent groups of the $R_1$-$R_{24}$ are connected to each other through a covalent bond to form a ring; and A and B are substituted or unsubstituted aryl containing 6-30 C atoms, or substituted or unsubstituted heteroaryl containing 5-30 C atoms.

5. The platinum complex according to claim 4, wherein among the $R_1$-$R_{24}$, $R_{17}$ and $R_{19}$ are tert-butyl, and the other groups are hydrogen.

6. The platinum complex according to claim 5, wherein the A and the B are a substituted or unsubstituted five-membered heteroaromatic ring, a six-membered aromatic ring, a six-membered heteroaromatic ring, or a five-membered benzo-heteroaromatic ring.

7. A platinum complex having an ONCN tetradentate ligand and containing carbazole, having a structure as shown in one of the following formulas:

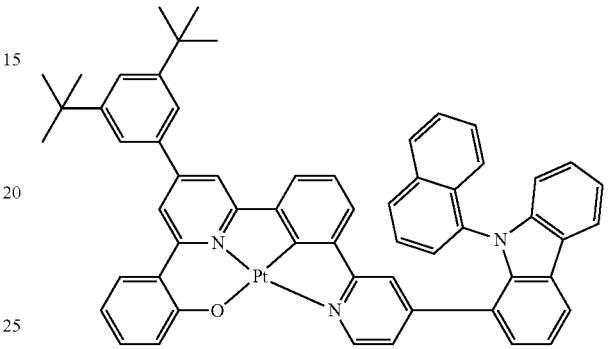

1

2

3

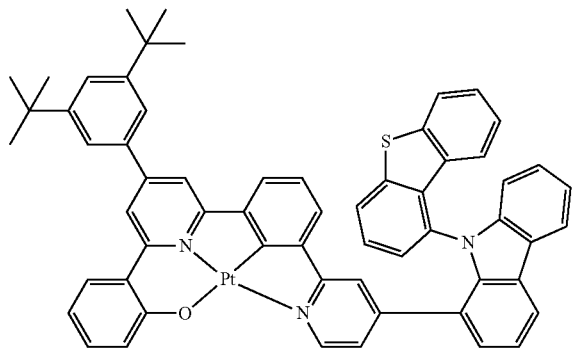
4
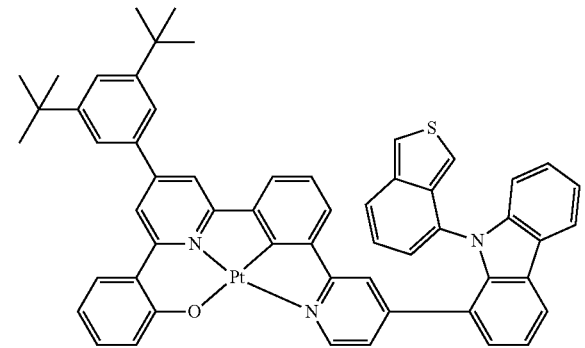
8
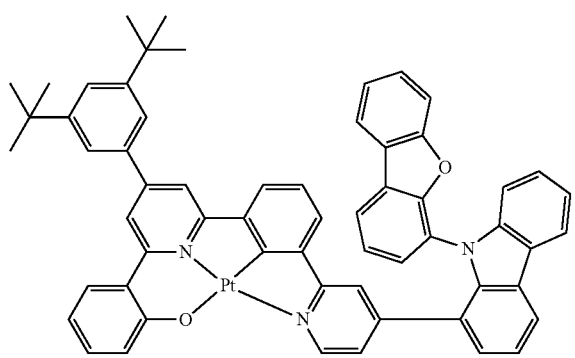
5
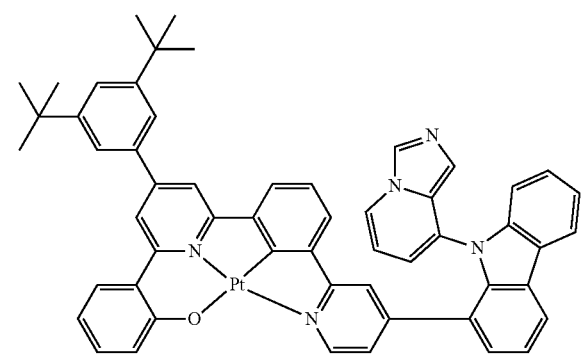
9
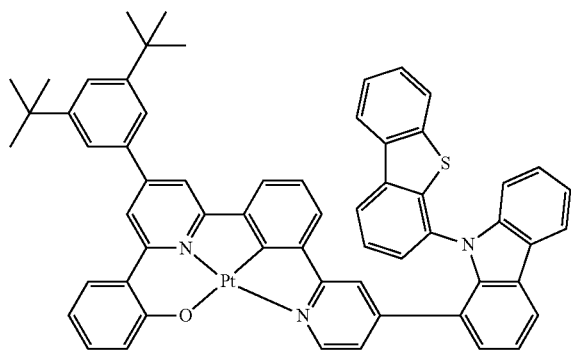
6
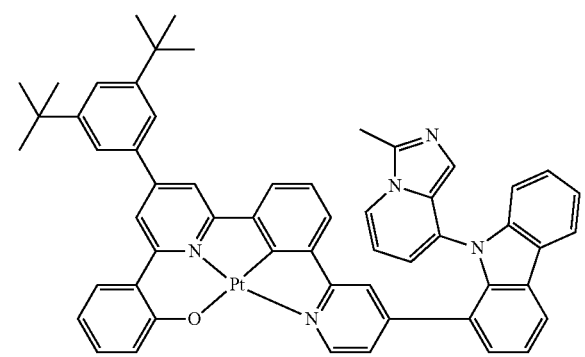
10
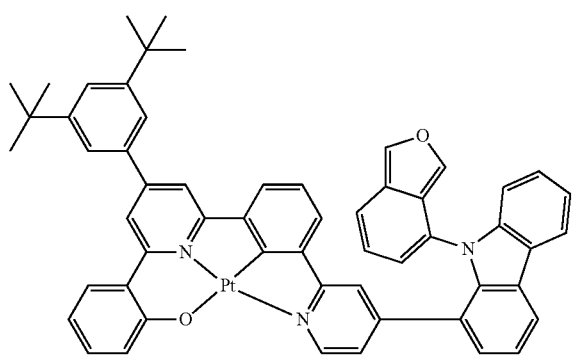
7
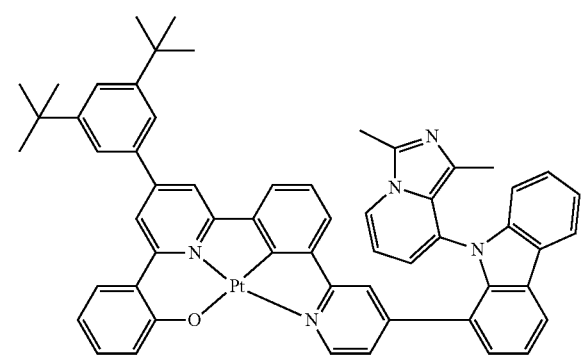
11

12
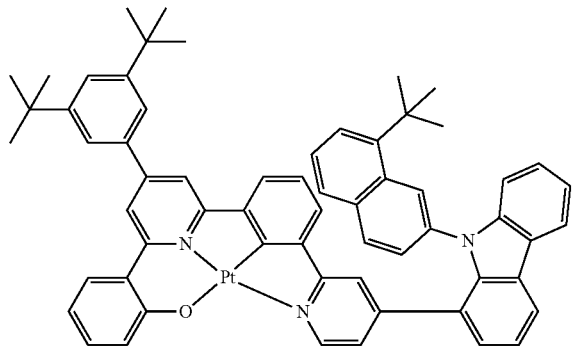
13
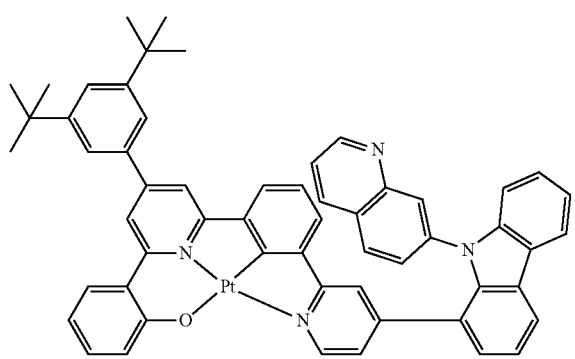
14
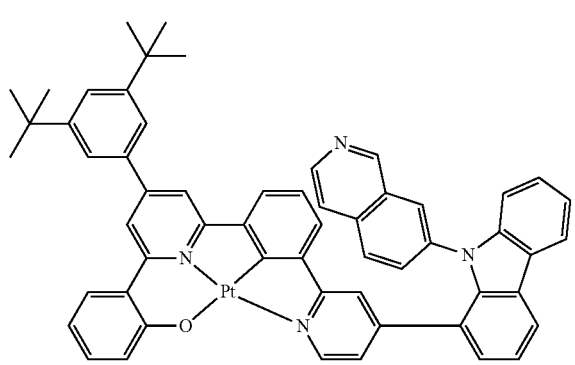
15
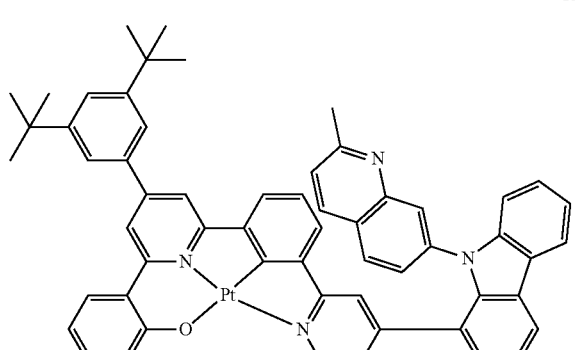
16
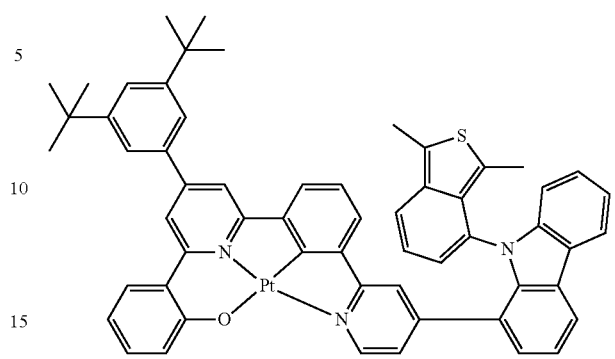
17
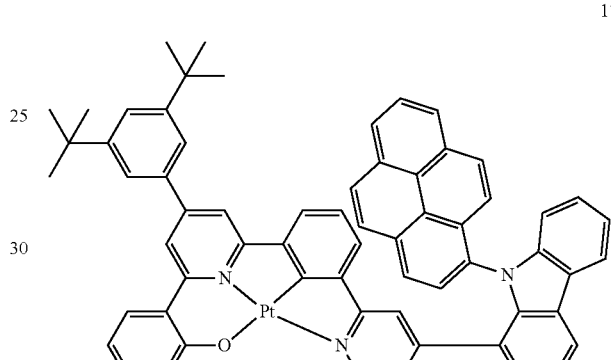
18
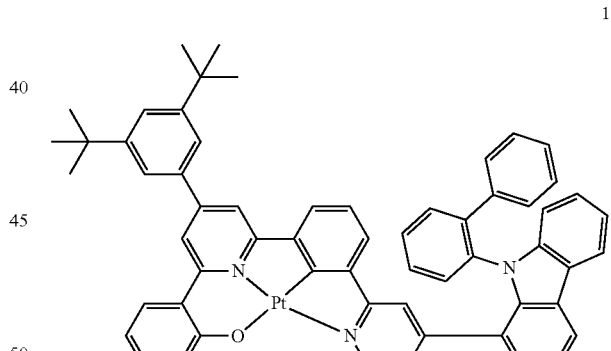
19
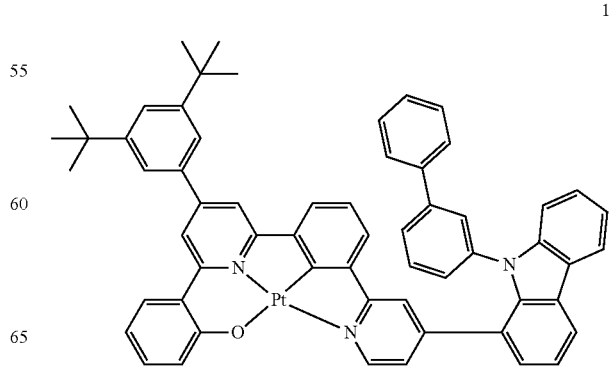

20
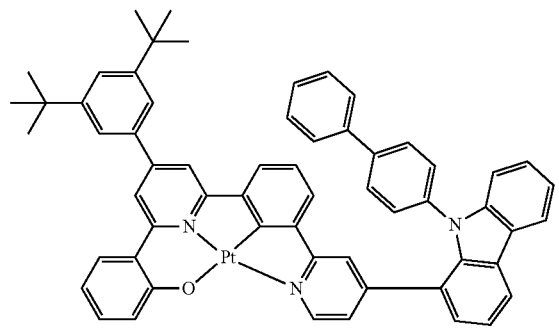
24
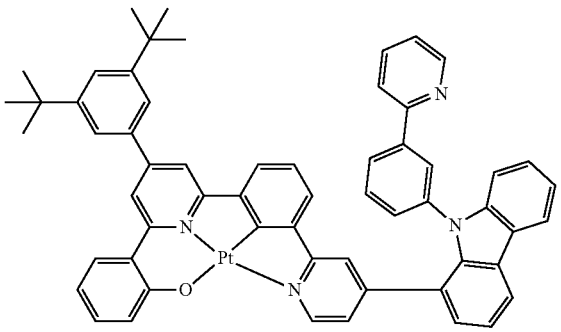
21
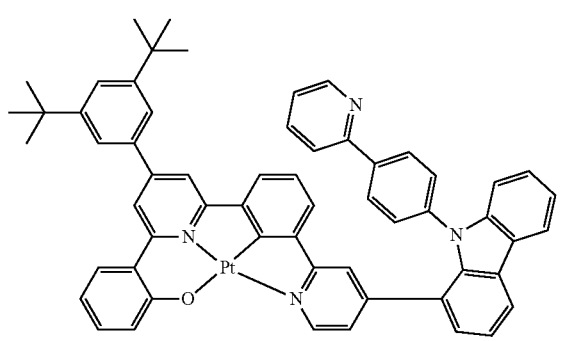
25
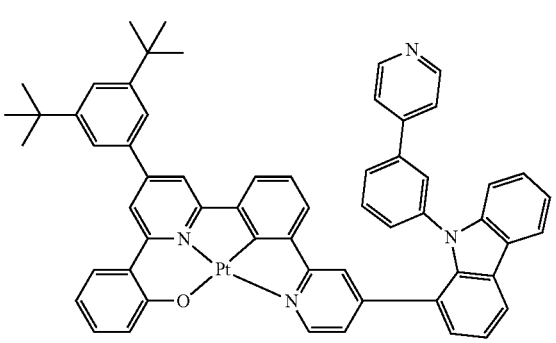
22
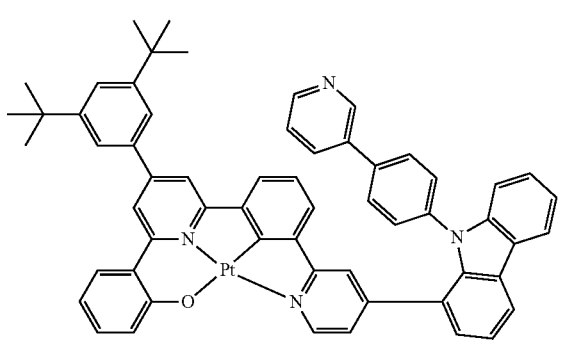
26
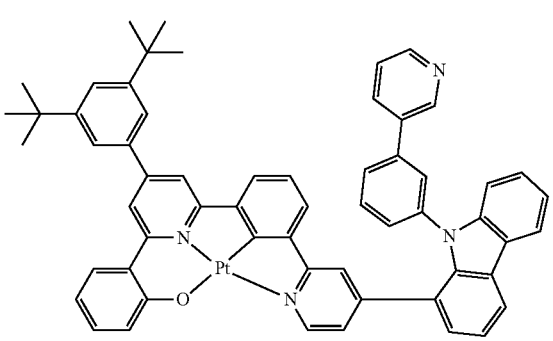
23
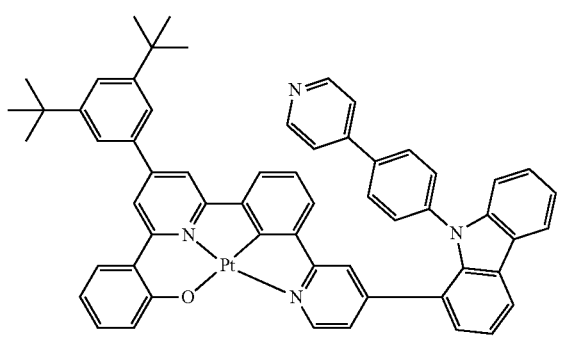
27
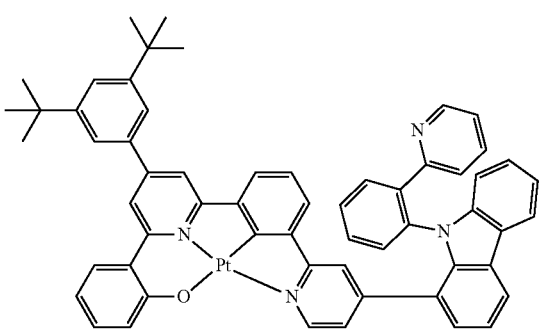

28
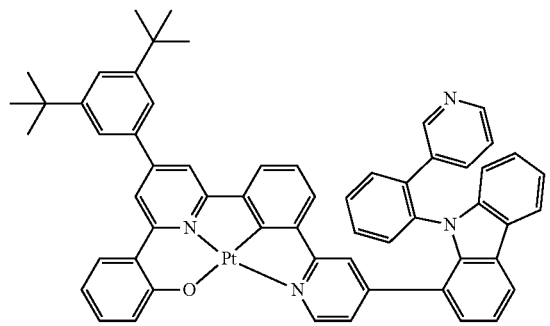
29
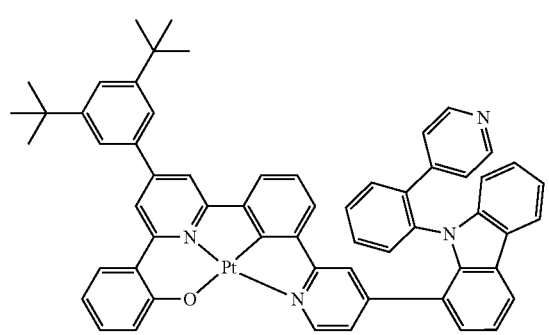
30
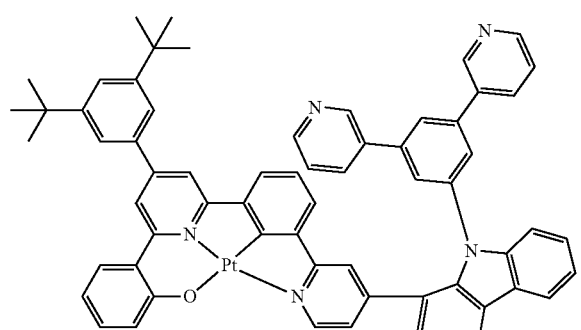
31
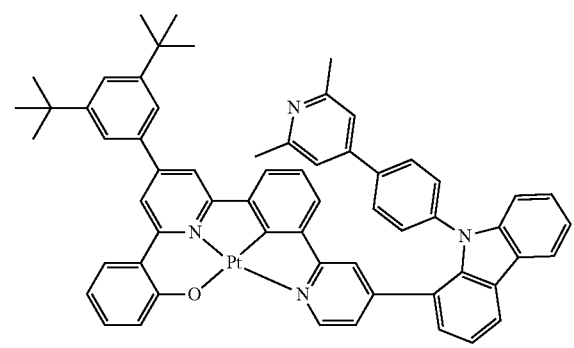
32
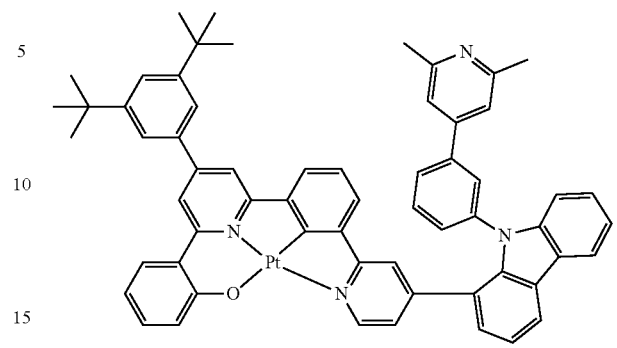
33
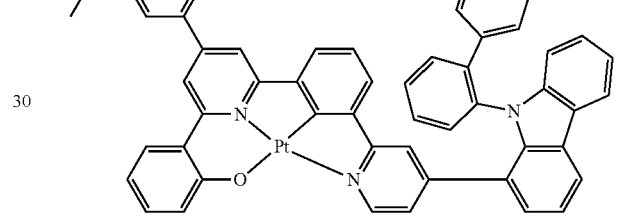
34
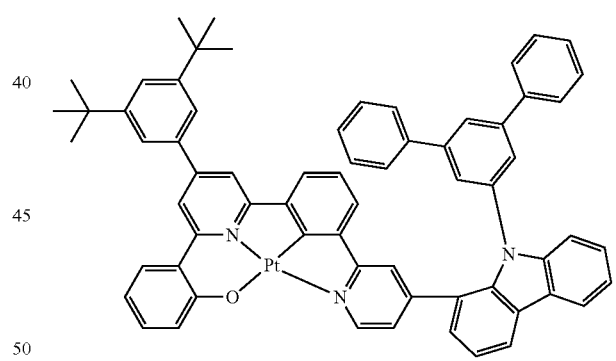
35
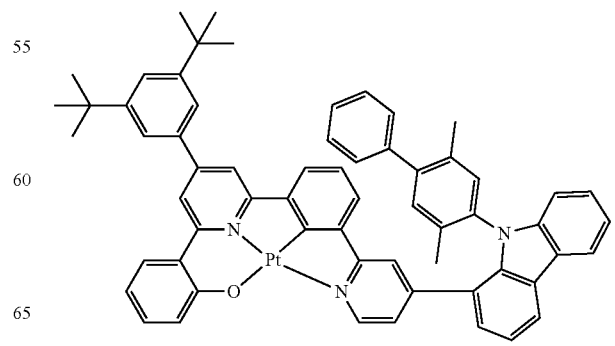

36
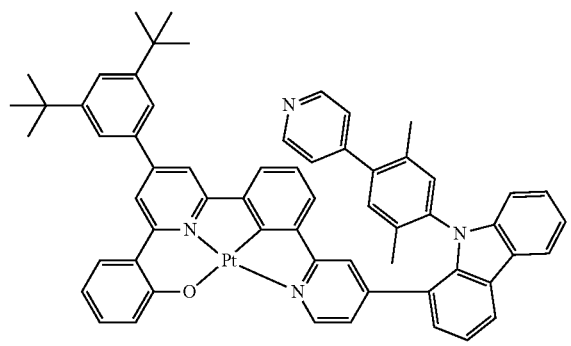
37
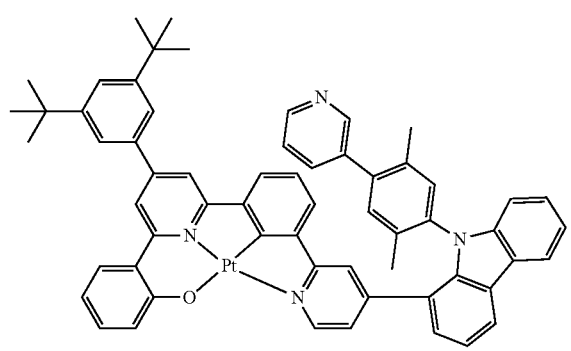
38
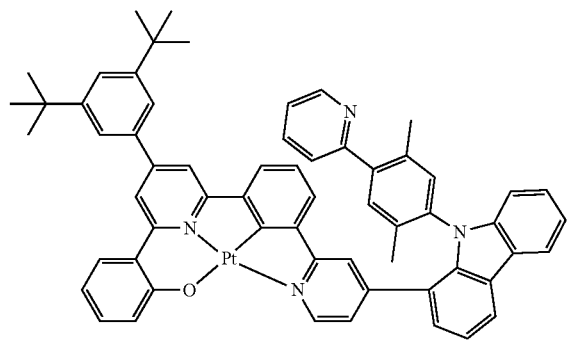
39
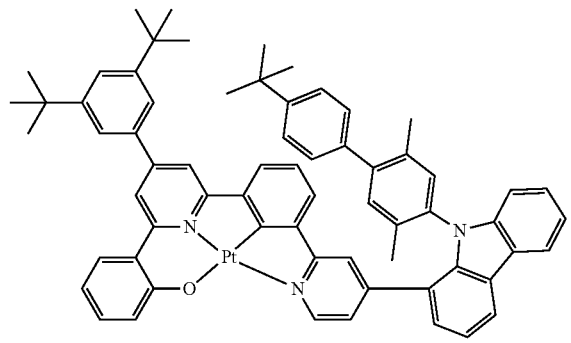
40
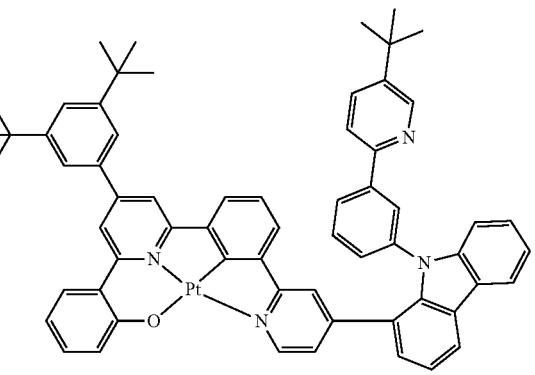
41
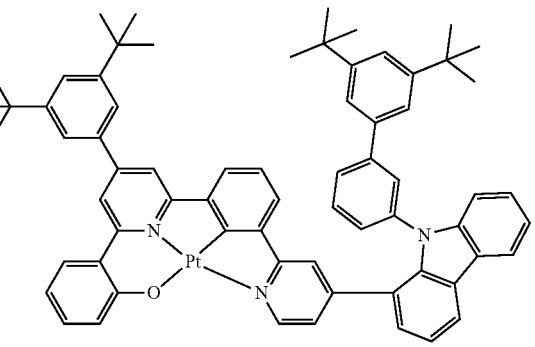
42
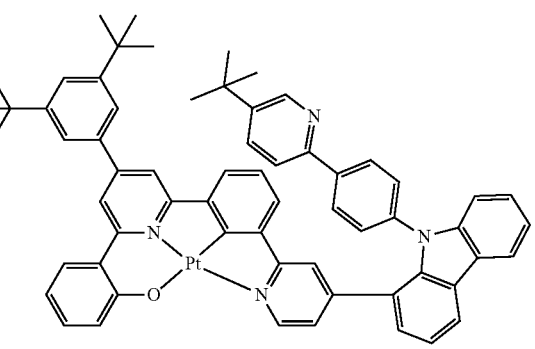
43
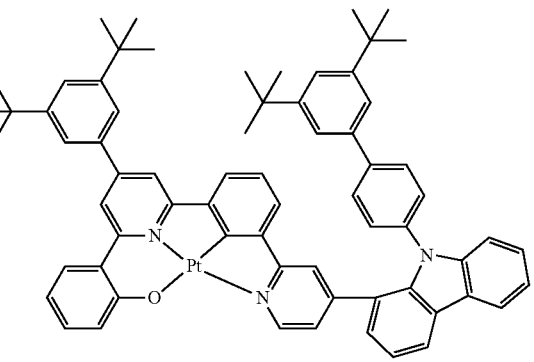

44
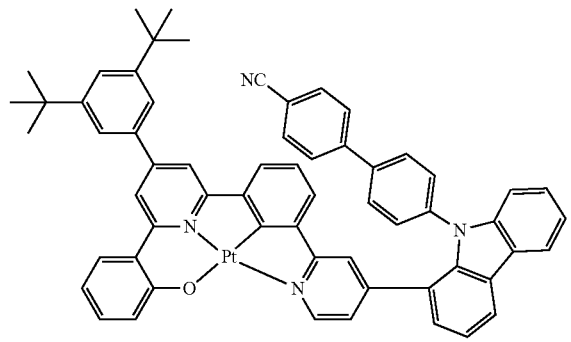
45
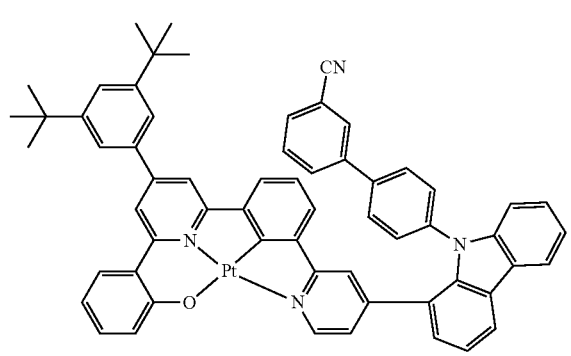
46
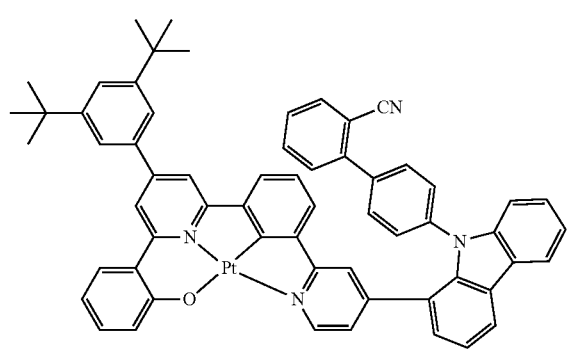
47
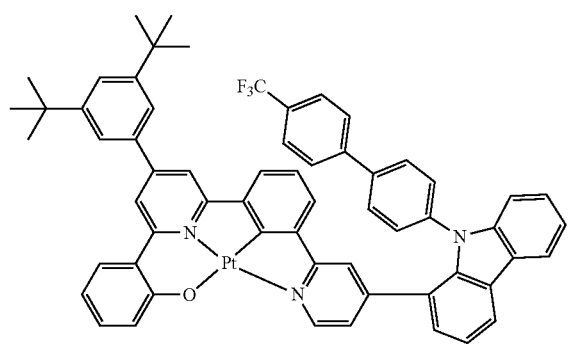
48
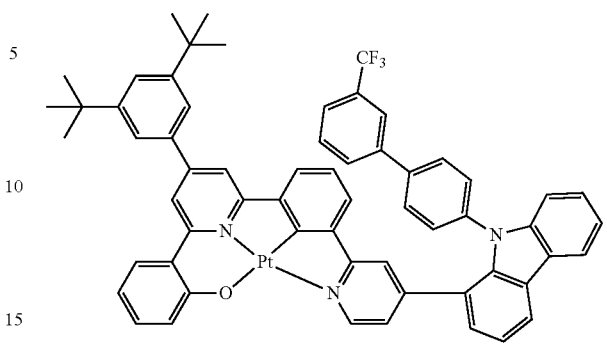
49
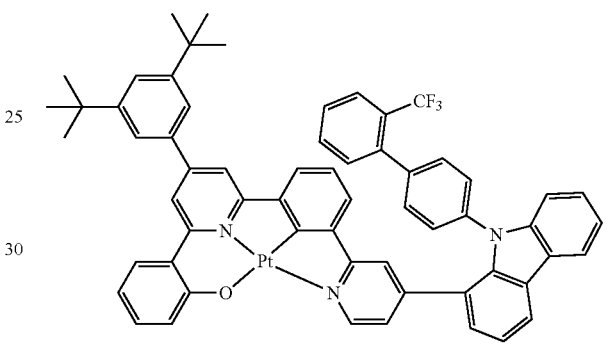
50
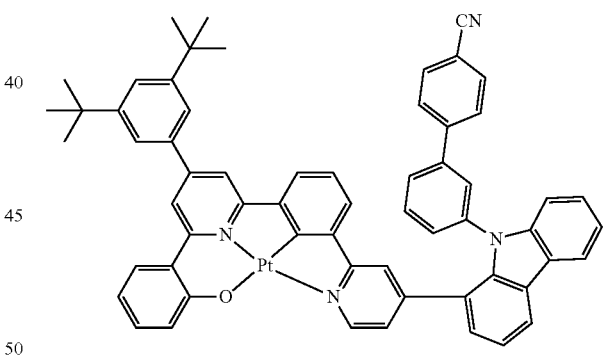
51
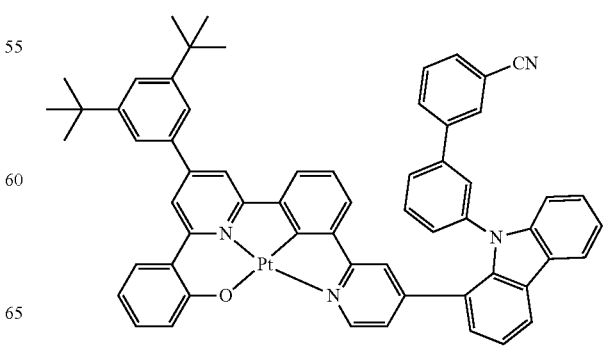

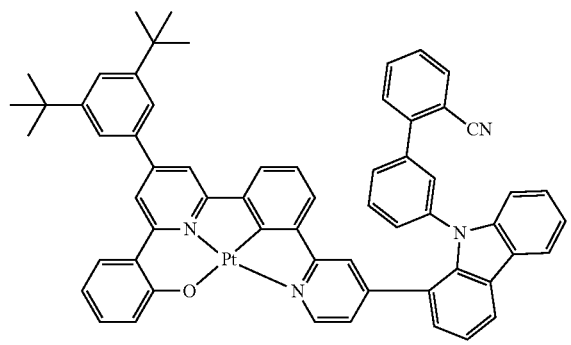
52
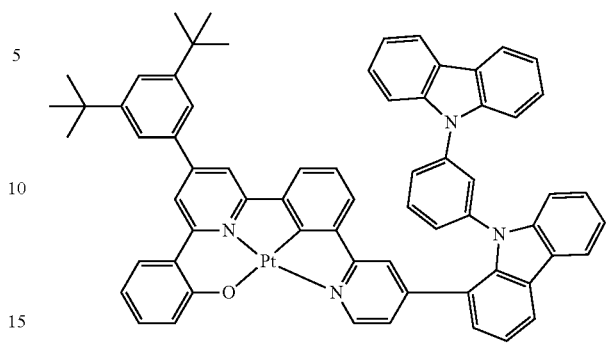
56
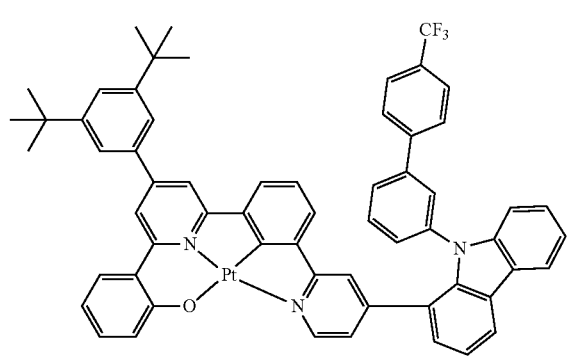
53
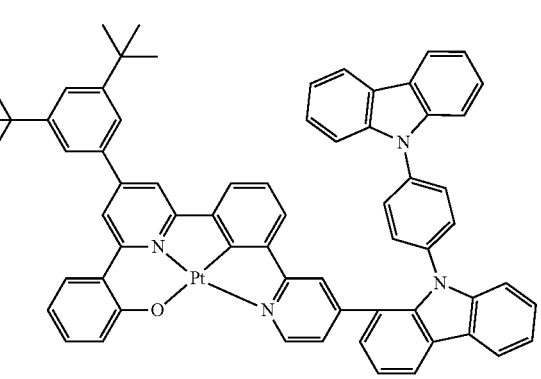
57
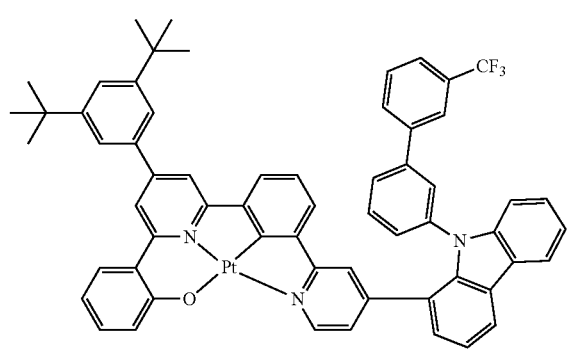
54
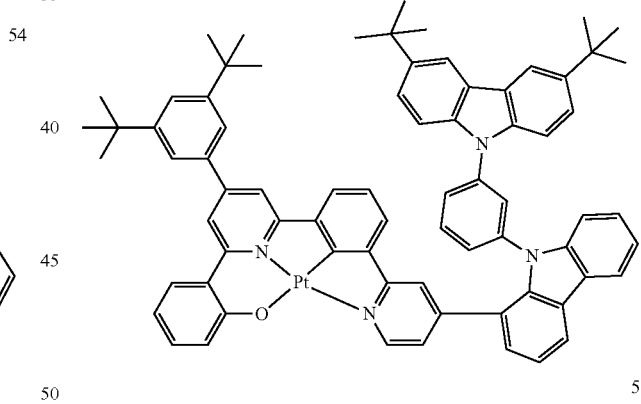
58
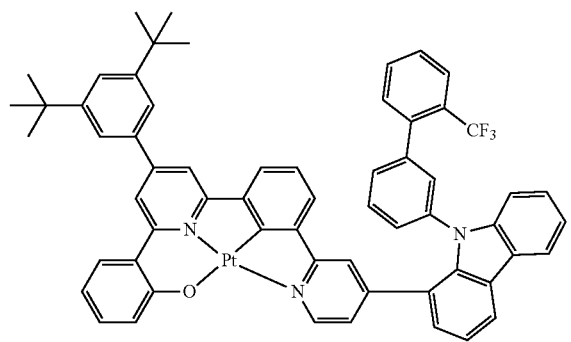
55
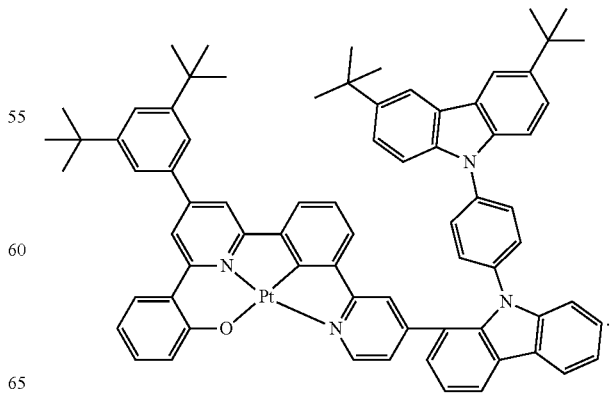
59

8. A precursor of the platinum complex according to claim 1, having the following structural formula:

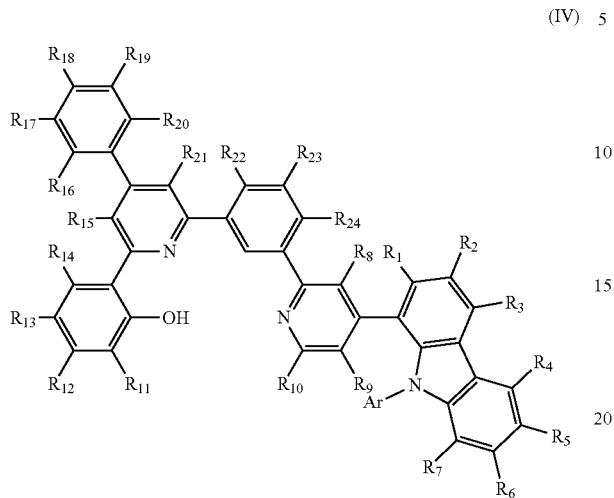

(IV)

wherein $R_1$-$R_{24}$ and Ar are defined the same as above.

9. A preparation method of the platinum complex according to claim 1, comprising a preparation route of: subjecting $A_R$ to a coupling reaction with $B_R$ to obtain $C_R$; subjecting the $C_R$ to a demethylation reaction under acidic conditions to obtain $D_R$; subjecting the $D_R$ to a hydroxyl halogenation reaction to obtain $E_R$; subjecting the $E_R$ to a coupling reaction with $F_R$ to obtain $G_R$;

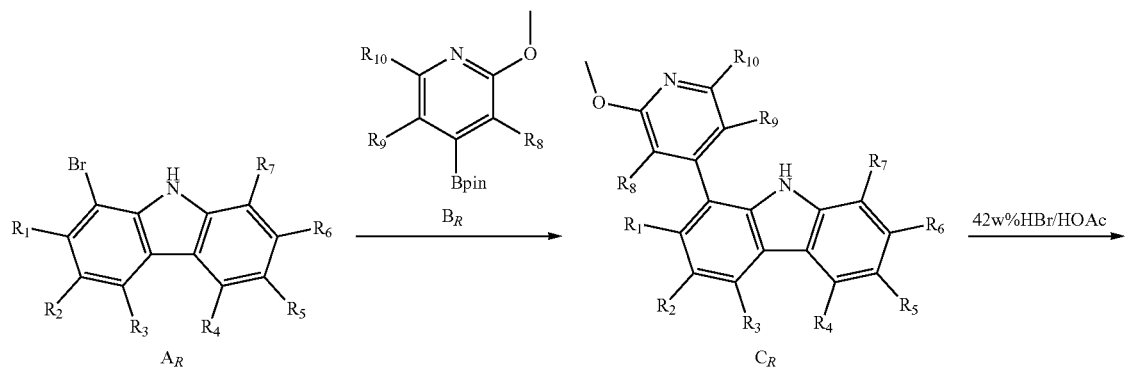

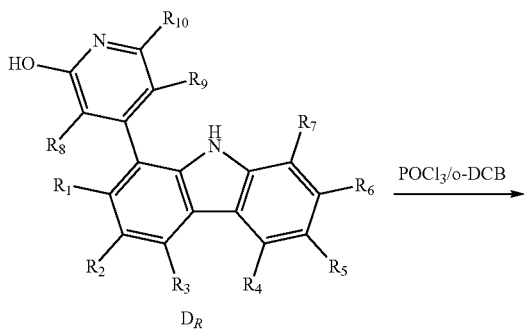

-continued
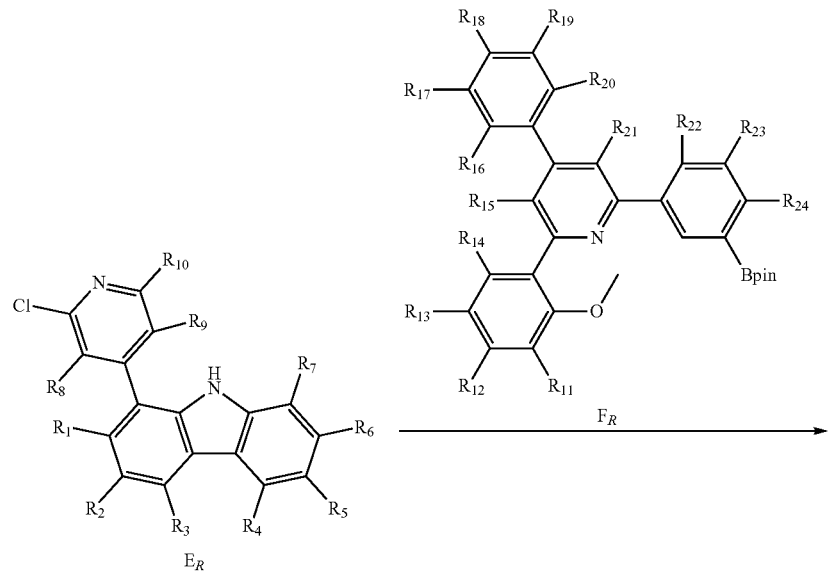
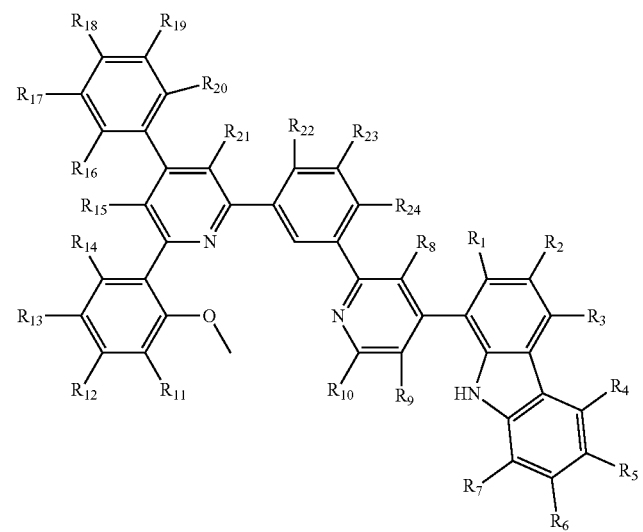

then subjecting the $G_R$ to a coupling reaction with a halogenated aromatic derivative to obtain $H_R$; subjecting the $H_R$ to demethylation under acidic conditions to obtain $I_R$; and finally, subjecting the $I_R$ to an ONCN tetradentate coordination reaction with metal platinum to obtain a $J_R$ type luminescent material,

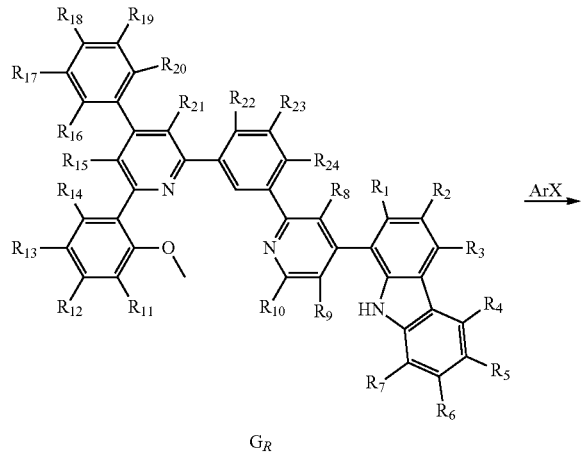

$G_R$

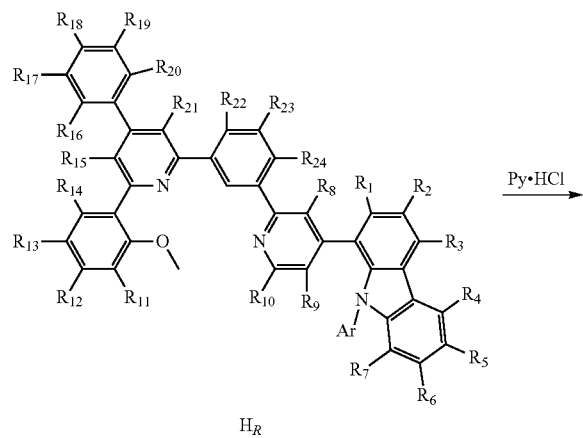

$H_R$

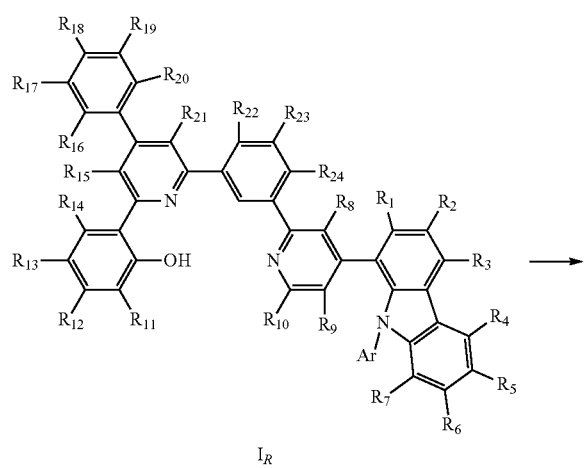

$I_R$

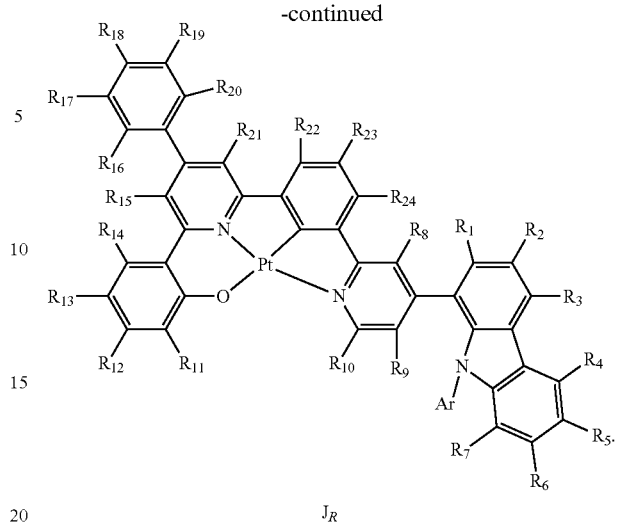

$J_R$

10. A precursor of the platinum complex according to claim 2, having the following structural formula:

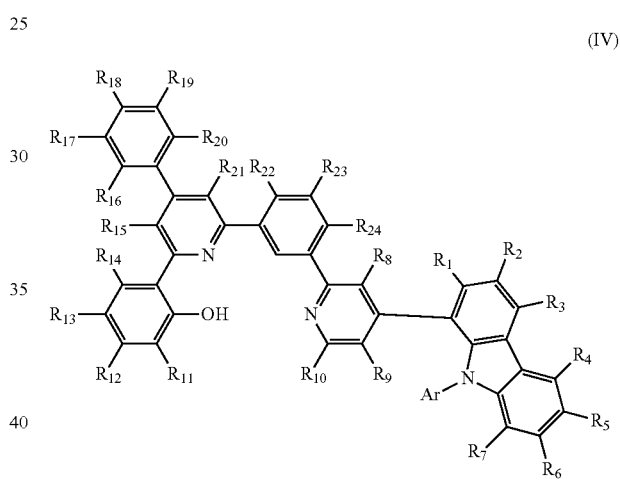

(IV)

wherein $R_1$-$R_{24}$ and Ar are defined the same as above.

11. A precursor of the platinum complex according to claim 3, having the following structural formula:

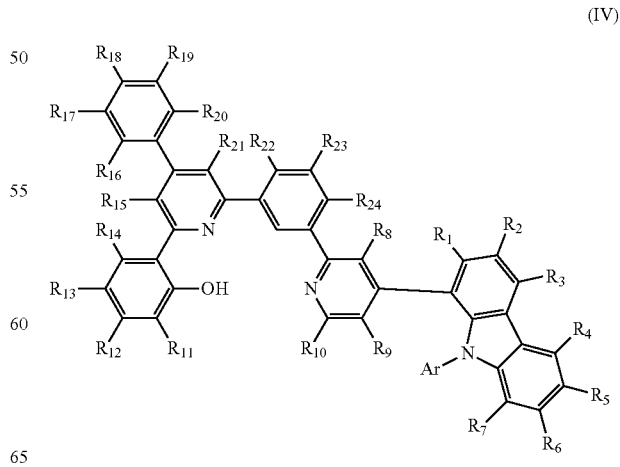

(IV)

wherein $R_1$-$R_{24}$ and Ar are defined the same as above.

12. An OLED comprising a light-emitting layer, wherein the light-emitting layer comprises a phosphorescent dopant material, and the phosphorescent dopant material comprises the platinum complex as claimed in claim 1.

13. An OLED comprising a light-emitting layer, wherein the light-emitting layer comprises a phosphorescent dopant material, and the phosphorescent dopant material comprises the platinum complex as claimed in claim 2.

14. An OLED comprising a light-emitting layer, wherein the light-emitting layer comprises a phosphorescent dopant material, and the phosphorescent dopant material comprises the platinum complex as claimed in claim 3.

15. An OLED comprising a light-emitting layer, wherein the light-emitting layer comprises a phosphorescent dopant material, and the phosphorescent dopant material comprises the platinum complex as claimed in claim 4.

16. An OLED comprising a light-emitting layer, wherein the light-emitting layer comprises a phosphorescent dopant material, and the phosphorescent dopant material comprises the platinum complex as claimed in claim 5.

17. An OLED comprising a light-emitting layer, wherein the light-emitting layer comprises a phosphorescent dopant material, and the phosphorescent dopant material comprises the platinum complex as claimed in claim 6.

* * * * *